(12) United States Patent
Lee et al.

(10) Patent No.: US 10,056,319 B2
(45) Date of Patent: Aug. 21, 2018

(54) POWER MODULE PACKAGE HAVING PATTERNED INSULATION METAL SUBSTRATE

(71) Applicant: Delta Electronics, Inc., Taoyuan (TW)

(72) Inventors: Chia-Yen Lee, Taoyuan (TW);
Hsin-Chang Tsai, Taoyuan (TW);
Peng-Hsin Lee, Taoyuan (TW);
Shiau-Shi Lin, Taoyuan (TW);
Tzu-Hsuan Cheng, Taoyuan (TW)

(73) Assignee: DELTA ELECTRONICS, INC., Taeyuan (TW)

( * ) Notice: Subject to any disclaimer, the term of this patent is extended or adjusted under 35 U.S.C. 154(b) by 0 days.

(21) Appl. No.: 15/484,714

(22) Filed: Apr. 11, 2017

(65) Prior Publication Data
US 2017/0317015 A1  Nov. 2, 2017

Related U.S. Application Data

(63) Continuation-in-part of application No. 15/142,588, filed on Apr. 29, 2016, now Pat. No. 9,865,531.

(51) Int. Cl.
*H01L 23/495* (2006.01)
*H01L 23/29* (2006.01)
(Continued)

(52) U.S. Cl.
CPC ........ *H01L 23/49586* (2013.01); *H01L 23/29* (2013.01); *H01L 23/3114* (2013.01); *H01L 23/49575* (2013.01); *H01L 24/09* (2013.01); *H01L 24/49* (2013.01); *H01L 25/0655* (2013.01); *H01L 2224/0233* (2013.01); *H01L 2224/40245* (2013.01);
(Continued)

(58) Field of Classification Search
CPC ......... H01L 23/49575; H01L 23/49548; H01L 24/49; H01L 21/4825
USPC .......................................... 257/676
See application file for complete search history.

(56) References Cited

U.S. PATENT DOCUMENTS

2009/0001554 A1* 1/2009 Otremba ............... H01L 24/33
257/708
2013/0154123 A1  6/2013 Poh et al.

FOREIGN PATENT DOCUMENTS

CN   101552255 (A)   10/2009
CN   201845773 (U)   5/2011
(Continued)

OTHER PUBLICATIONS

Office Action corresponding to TW application 105122651 dated Dec. 26, 2017; pp. 1-6.
(Continued)

*Primary Examiner* — Theresa T Doan
(74) *Attorney, Agent, or Firm* — Muncy, Geissler, Olds & Lowe, P.C.

(57) ABSTRACT

A packaging structure is provided, including a substrate, a first chip, a second chip, and a conductive unit. The substrate includes a metal carrier, a patterned insulation layer disposed on the metal carrier and partially covering the metal carrier, and a patterned conductive layer disposed on the patterned insulation layer. The first chip is disposed on the metal carrier not covered by the patterned insulation layer. The second chip is disposed on the patterned conductive layer and electrically connected to the first chip by the conductive unit.

17 Claims, 27 Drawing Sheets

(51) Int. Cl.
*H01L 23/31* (2006.01)
*H01L 23/00* (2006.01)
*H01L 25/065* (2006.01)

(52) U.S. Cl.
CPC ............... *H01L 2224/48137* (2013.01); *H01L 2224/49105* (2013.01); *H01L 2924/13064* (2013.01); *H01L 2924/19105* (2013.01)

(56) References Cited

FOREIGN PATENT DOCUMENTS

| CN | 103855914 (A) | 6/2014 |
| TW | 201301460 (A) | 1/2013 |

OTHER PUBLICATIONS

Office Action corresponding to TW application 106113887 dated Mar. 7, 2018; pp. 1-6.

\* cited by examiner

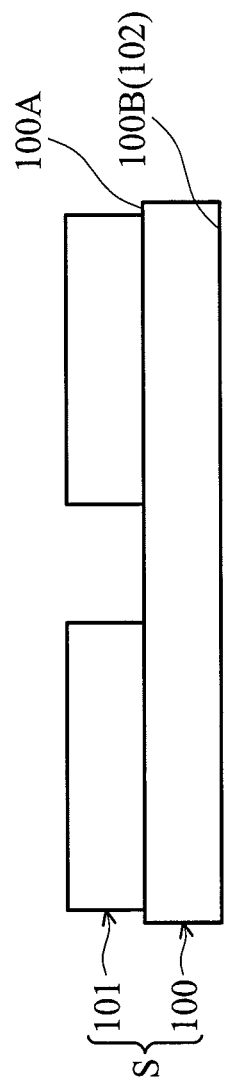
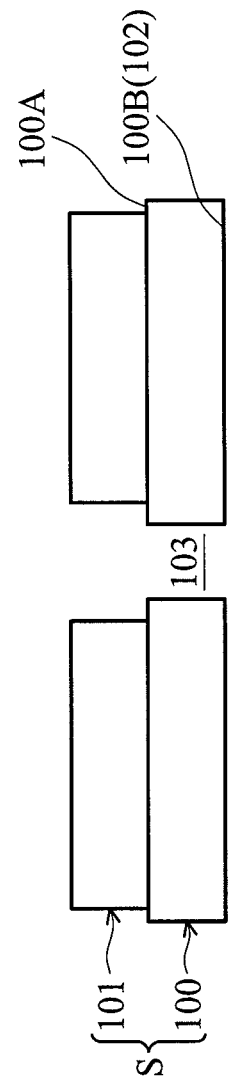
FIG. 9C
FIG. 9D ardous
POWER MODULE PACKAGE HAVING PATTERNED INSULATION METAL SUBSTRATE This Application claims priority of U.S. patent application Ser. No. 15/142,588, filed on Apr. 29, 2016, the entirety of which is incorporated by reference herein.

BACKGROUND

Field of the Invention

The present application relates to a semiconductor package, and in particular to a power module package having a patterned insulation metal substrate (PIMS).

Description of the Related Art

Power module packages have been widely applied in automobiles, industrial equipment, and household electrical appliances. In general, in power module packages, one or more semiconductor power chips are mounted on a metal carrier and encapsulated with an epoxy molding compound (EMC) to protect internal parts.

FIG. 1 shows a schematic cross-sectional view of a traditional power module package 1. The traditional power module package 1 primarily includes a metal carrier 10A, a full-faced insulation layer 11 on the metal carrier 10A, a patterned conductive layer 12 on the insulation layer 11 (the metal carrier 10A, the insulation layer 11, and the conductive layer 12 compose a metal substrate of the traditional power module package 1), and a plurality of power chips 13 which are electrically connected to the parts of the conductive layer 12 and which are electrically connected to each other via a plurality of wires 14.

However, owing to the aforementioned structural feature of the substrate (the metal carrier 10A, the insulation layer 11, and the conductive layer 12 are stacked on each other), the traditional power module package 1 usually has a poor ability to dissipate heat. Consequently, the reliability of the traditional power module package 1 is adversely affected.

BRIEF SUMMARY

In view of the aforementioned problems, an embodiment of the invention provides a substrate (a patterned insulation metal substrate (PIMS)), comprising a metal carrier, a patterned insulation layer, and a patterned conductive layer. The patterned insulation layer is disposed on the metal carrier and partially covers the metal carrier. The patterned conductive layer is disposed on the patterned insulation layer.

Another embodiment of the invention provides a power module package, comprising a substrate (a patterned insulation metal substrate (PIMS)), a first chip, and a second chip. The substrate includes a metal carrier, a patterned insulation layer disposed on the metal carrier and partially covering the metal carrier, and a patterned conductive layer disposed on the patterned insulation layer. The first chip is disposed on the metal carrier not covered by the patterned insulation layer. The second chip is disposed on the patterned conductive layer and is electrically connected to the first chip.

Another embodiment of the invention provides a method of manufacturing a patterned insulation metal substrate, comprising: providing a substrate including an insulation layer and a patterned conductive layer covering a top surface of the insulation layer; forming an adhesive side on a bottom surface of the insulation layer; forming an opening through the insulation layer; and laminating a patterned metal carrier to the adhesive side of the insulation layer.

Another embodiment of the invention provides a method of manufacturing a patterned insulation metal substrate, comprising: providing a substrate including an insulation layer and a patterned conductive layer covering a top surface of the insulation layer; forming an adhesive side on a bottom surface of the insulation layer; forming an opening through the insulation layer; laminating a metal carrier to the adhesive side of the insulation layer; and patterning the metal carrier.

Another embodiment of the invention provides a packaging structure, comprising a substrate (a patterned insulation metal substrate (PIMS)), a first chip, a second chip, and a conductive unit. The substrate includes a metal carrier, a patterned insulation layer disposed on the metal carrier and partially covering the metal carrier, and a patterned conductive layer disposed on the patterned insulation layer. The first chip is disposed on the metal carrier not covered by the patterned insulation layer. The second chip is disposed on the patterned conductive layer and is electrically connected to the first chip by a conductive unit.

BRIEF DESCRIPTION OF THE DRAWINGS

The invention can be more fully understood by reading the subsequent detailed description and examples with references made to the accompanying drawings, wherein:

FIGS. 9A to 9E are schematic cross-sectional views illustrating a method of manufacturing a patterned insulation metal substrate of a power module package in accordance with an embodiment of the invention;

DETAILED DESCRIPTION OF THE INVENTION

Figure 1:
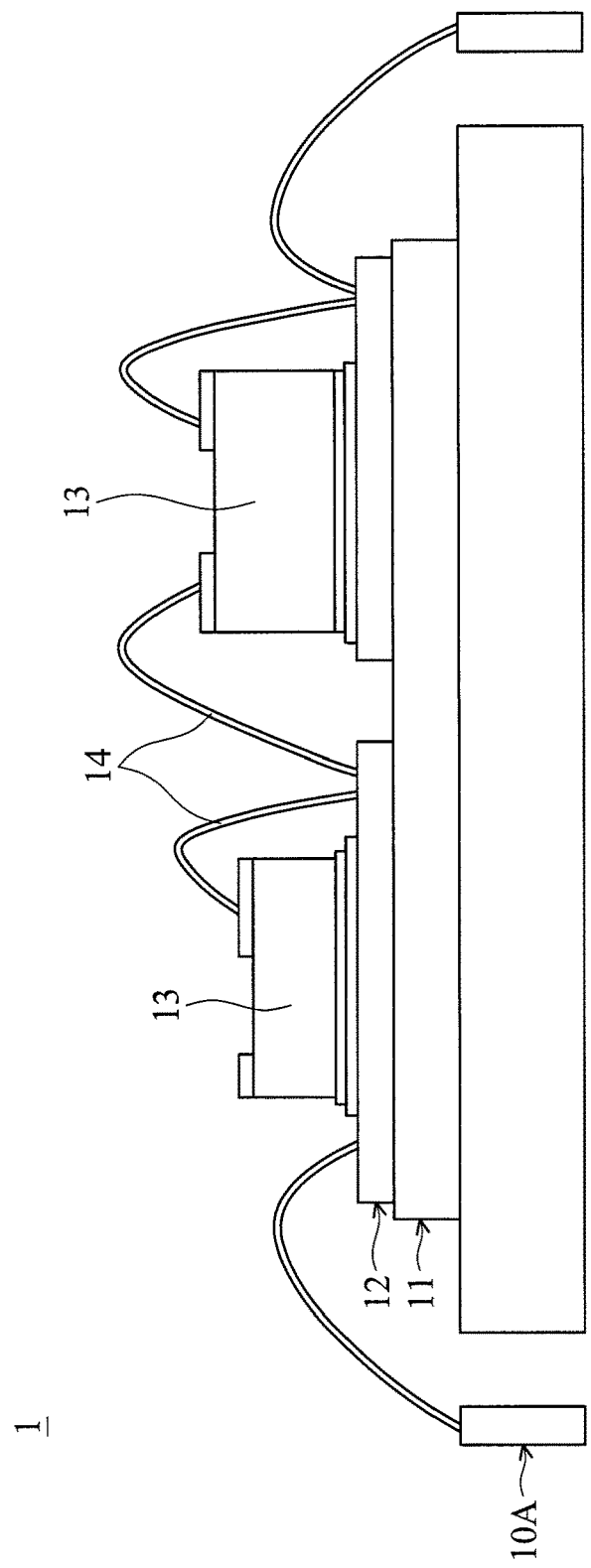
FIG. 1 is a schematic cross-sectional view of a traditional power module package.

In order to illustrate the purposes, features, and advantages of the invention, the preferred embodiments and drawings of the invention are shown in detail as follows.

In the following detailed description, the orientations of "on", "above", "under", and "below" are used for representing the relationship between the relative positions of each element as illustrated in the drawings, and are not meant to limit the invention.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Furthermore, some elements not shown or described in the embodiments have the forms known by persons skilled in the field of the invention.

Figure 2:
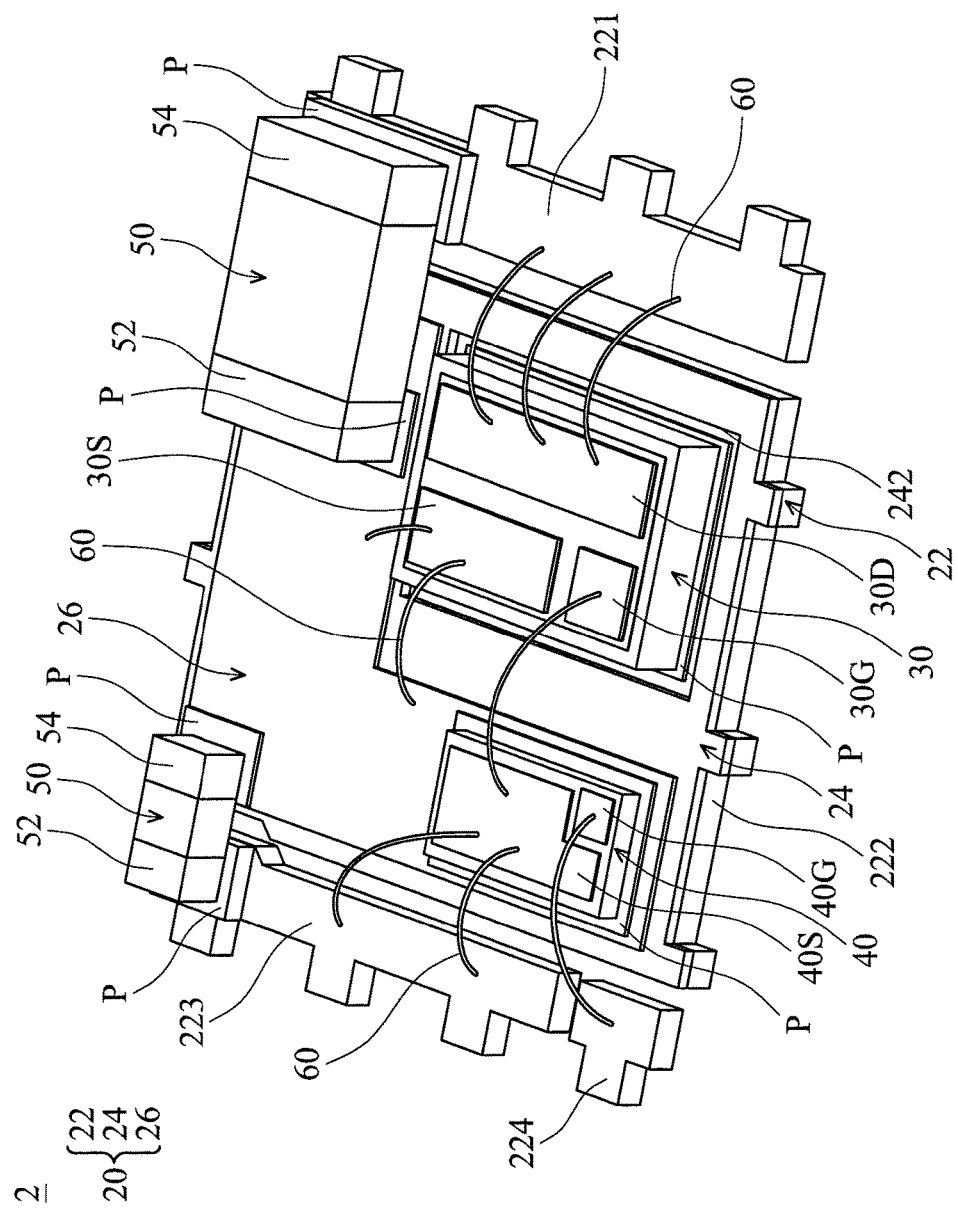
FIG. 2 is a schematic perspective view of a power module package in accordance with an embodiment of the invention.
Figure 3:
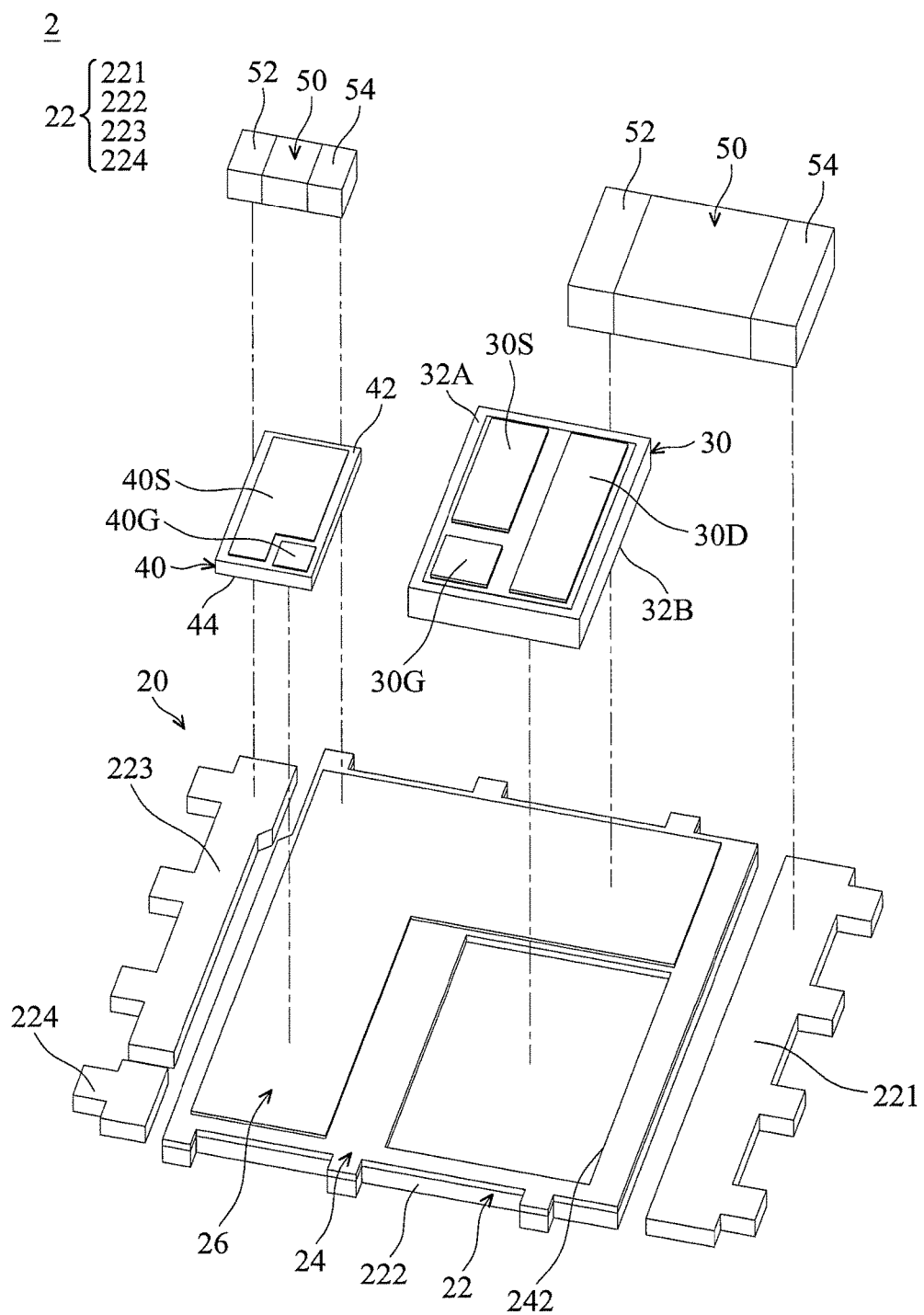
FIG. 3 is an exploded view of the power module package in FIG. 2.
Figure 4:
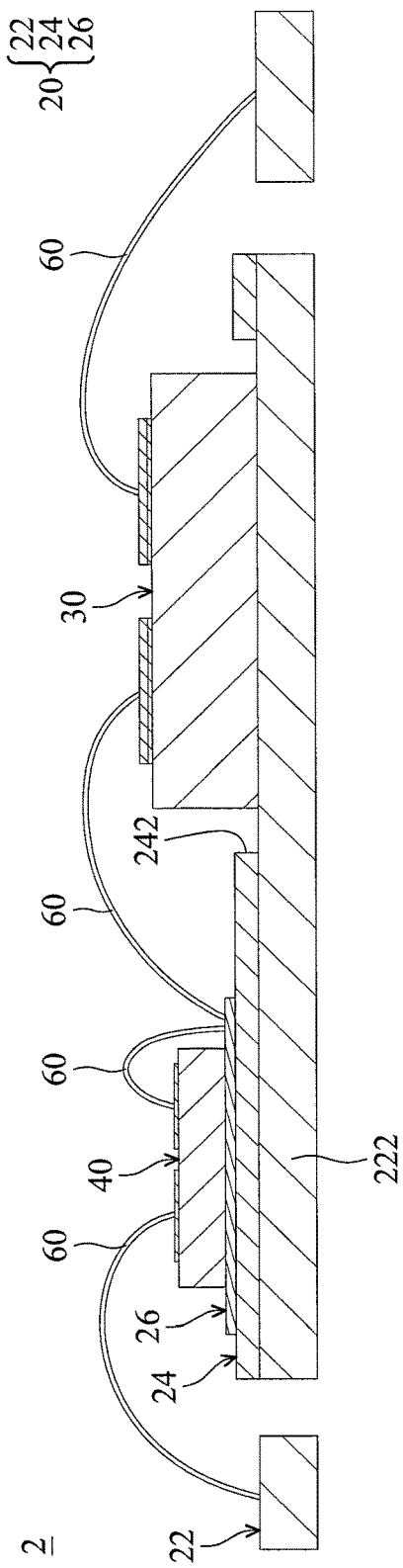
FIG. 4 is a schematic cross-sectional view of the power module package in FIG. 2.

Refer to FIGS. 2~4, wherein FIG. 2 is a schematic perspective view of a power module package 2 in accordance with an embodiment of the invention, FIG. 3 is an exploded view of the power module package 2 in FIG. 2, and FIG. 4 is a schematic cross-sectional view of the power module package 2 in FIG. 2. The power module package 2 in accordance with an embodiment of the invention includes a patterned insulation metal substrate (PIMS) 20, a first semiconductor power chip 30, a second semiconductor power chip 40, two passive components 50, and a plurality of wires 60. It should be realized that an encapsulation layer, such as an epoxy molding compound (EMC) covering the first semiconductor power chip 30, the second semiconductor power chip 40, the passive components 50, and the wires 60 on the patterned insulation metal substrate 20, is omitted in FIGS. 2~4.

As shown in FIGS. 2~4, the patterned insulation metal substrate 20 includes a carrier 22, an insulation layer 24, and a conductive layer 26. In this embodiment, the carrier 22 is a lead frame including several patterned and separated parts. Specifically, the carrier 22 is made of metal (e.g. copper) and includes a first part 221, a second part 222, a third part 223, and a fourth part 224. The insulation layer 24 may comprise fiberglass, epoxy fiberglass, epoxies, silicones, urethanes, or acrylates which could add aluminum oxide, boron nitride, zinc oxide or aluminum nitride as fillers to increase thermal conductivity, and is formed on the carrier 22. It should be noted that the insulation layer 24 is a patterned insulation layer which partially covers the second part 222 of the metal carrier 22. In this embodiment, the patterned insulation layer 24 has at least one opening 242 such that at least one part of the second part 222 of the metal carrier 22 is exposed. Moreover, the conductive layer 26 is also made of metal (e.g. copper), and is formed on the insulation layer 24. It should be noted that the conductive layer 26 is a patterned conductive layer which partially covers the insulation layer 24. In this embodiment, the patterned conductive layer 26 is L-shaped, adjacent to the edges of the insulation layer 24, and partially surrounds the opening 242 of the insulation layer 24 (see FIG. 3), but the invention is not limited thereto.

As shown in FIGS. 2~4, the first semiconductor power chip 30 is disposed on the second part 222 of the metal carrier 22 not covered by the insulation layer 24. More specifically, the first semiconductor power chip 30 is disposed in the opening 242 of the insulation layer 24 and directly connected to the metal carrier 22. Thus, the heat generated from the first semiconductor power chip 30 can be effectively dissipated through a bottom surface (not covered by the insulation layer 24) of the metal carrier 22. Conversely, in the traditional power module package 1 illustrated in FIG. 1, the heat generated from the power chips 13 cannot be effectively dissipated through the metal carrier 10A due to blocking from the full-faced insulation layer 11. Therefore, with the design of the patterned insulation layer 24, the power module package 2 of this embodiment can have a better heat dissipation ability, thereby having an improved reliability.

As shown in FIGS. 2-4, the second semiconductor power chip 40 is disposed on the conductive layer 26. In addition, the first and second semiconductor power chips 30 and 40 can be mounted on the metal carrier 22 and the conductive layer 26, respectively, by an interface material P, and the interface material P may comprise metal alloy, solder paste, silver adhesive, or other conductive adhesive.

In this embodiment, the first semiconductor power chip 30 such as a High-Voltage (HV) switch is a lateral semiconductor component, and the second semiconductor power chip 40 such as a Low-Voltage (LV) switch is a vertical semiconductor component.

As shown in FIG. 2 and FIG. 3, the first semiconductor power chip 30 has an active side (i.e. a top surface 32A) with electrodes (comprising a first drain pad 30D, a first source pad 30S, and a first gate pad 30G) thereon and a bottom side (i.e. a bottom surface 32B) opposite to the active side, and the first semiconductor power chip 30 is disposed on the metal carrier 22 via the bottom side. It should be noted that the second part 222 of the metal carrier 22 is not electrically connected to the first semiconductor power chip 30 (a lateral semiconductor component), and has merely the same electric properties as the bottom side of the first semiconductor power chip 30. Accordingly, the bottom surface of the second part 222 of the metal carrier 22 can be directly exposed to the outside environment, thereby facilitating good heat dissipation, and having no need to be covered by an insulation layer for insulation concerns. In addition, the second semiconductor power chip 40 has a top surface 42 with electrodes (comprising a second source pad 40S and a second gate pad 40G) thereon and a bottom surface 44, opposite to the top surface 42, with an electrode (a second drain pad (not shown)) thereon, and the second semiconductor power chip 40 is disposed on the conductive layer 26 via the bottom surface 44.

As shown in FIG. 2, in this embodiment, the first drain pad 30D of the first semiconductor power chip 30 is electrically connected to the first part 221 of the metal carrier 22 via at least one of the wires 60, the first source pad 30S is electrically connected to the conductive layer 26 via at least one of the wires 60, and the first gate pad 30G is electrically connected to the second source pad 40S of the second semiconductor power chip 40 via at least one of the wires 60. In addition, the second source pad 40S of the second semiconductor power chip 40 is electrically connected to the third part 223 of the metal carrier 22 via at least one of the wires 60, the second gate pad 40G is electrically connected to the fourth part 224 of the metal carrier 22 via at least one of the wires 60, and the second drain pad on the bottom surface 44 of the second semiconductor power chip 40 is electrically connected to the conductive layer 26 (i.e. it is also electrically connected to the first source pad 30S of the first semiconductor power chip 30).

Furthermore, in this embodiment, the first semiconductor power chip 30 includes a plurality of HV transistors connected in parallel (not shown in the drawings), wherein each of the HV transistors, such as a lateral type Depletion mode (D-mode) transistor has a first source electrode electrically connected to the first source pad 30S, a first drain electrode electrically connected to the first drain pad 30D, and a first gate electrode electrically connected to the first gate pad 30G. Moreover, each of the HV transistors in the first semiconductor power chip 30 is a nitride-based transistor, such as a High Electron Mobility Transistor (HEMT) comprising Gallium Nitride (GaN). In addition, in this embodiment, the second semiconductor power chip 40 includes a plurality of LV transistors connected in parallel (not shown in the drawings), wherein each of the LV transistors, such as a vertical type Enhancement mode (E-mode) transistor has a second source electrode electrically connected to the second source pad 40S, a second drain electrode electrically connected to the second drain pad, and a second gate electrode electrically connected to the second gate pad 40G. Moreover, each of the LV transistors is a silicon-based transistor.

As shown in FIG. 2 and FIG. 3, the two passive components 50 are disposed on the patterned insulation metal substrate 20. Specifically, each of the passive components 50 may be a resistor, a capacitor, or an inductor, and has a first terminal 52 and a second terminal 54. In this embodiment, one of the passive components 50 is electrically connected to the first part 221 of the metal carrier 22 and the conductive layer 26, and the other passive component 50 is electrically connected to the conductive layer 26 and the third part 223 of the metal carrier 22. In addition, the two passive components 50 can also be mounted on the patterned insulation metal substrate 20 by an interface material P, and the interface material P may comprise metal alloy, solder paste, silver adhesive, or other conductive adhesive.

With the aforementioned structural features, a cascade switch circuit including the first semiconductor power chip 30, the second semiconductor power chip 40, and the two passive components 50 can be achieved. Compared to a single switch circuit, the cascade switch circuit is better able to supply higher voltage and switch faster.

It should be noted that the power module package 2 described above can be applied to a power related product, such as a transformer or a power supply. Moreover, with the design of the patterned insulation metal substrate (PIMS) 20, the power module package 2 can have a better heat dissipation ability and improved reliability, compared with the traditional power module package 1 (FIG. 1).

In the aforementioned embodiment, although the first semiconductor power chip 30 is a lateral semiconductor component, the invention is not limited thereto. In some embodiments, the first semiconductor power chip 30 may also be a vertical semiconductor component if the bottom surface of the metal carrier 22 is covered by an insulation layer. In some embodiments, the first and second semiconductor power chips 30 and 40 may also be other active components or drivers, rather than an HV switch and an LV switch.

Next, some power module packages with different structures in accordance with various embodiments of the invention are illustrated below.

Figure 5:
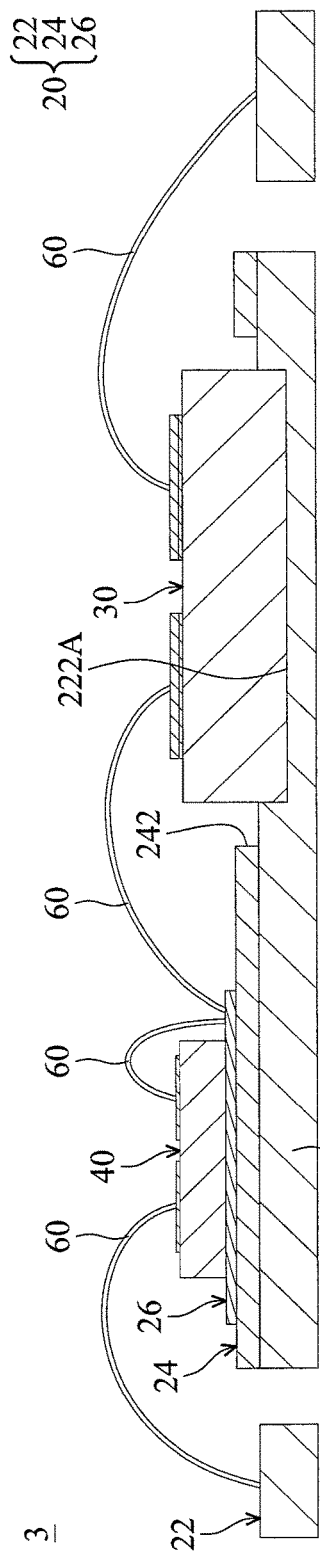
FIG. 5 is a schematic cross-sectional view of a power module package in accordance with another embodiment of the invention.

FIG. 5 illustrates a schematic cross-sectional view of a power module package 3 in accordance with another embodiment of the invention. The power module package 3 differs from the power module package 2 (FIG. 2) described above in that the second part 222 of the metal carrier 22 further includes a cavity 222A (or a recess or a slot) which is formed on the top surface thereof and which is not covered by the insulation layer 24 (i.e. formed in the opening 242), and the first semiconductor power chip 30 is disposed therein. Since the first semiconductor power chip 30 abuts the side walls and bottom surface of the cavity 222A, the heat generated from the first semiconductor power chip 30 can be transferred to the metal carrier 22 more easily and then be effectively dissipated through the metal carrier 22.

Figure 6:
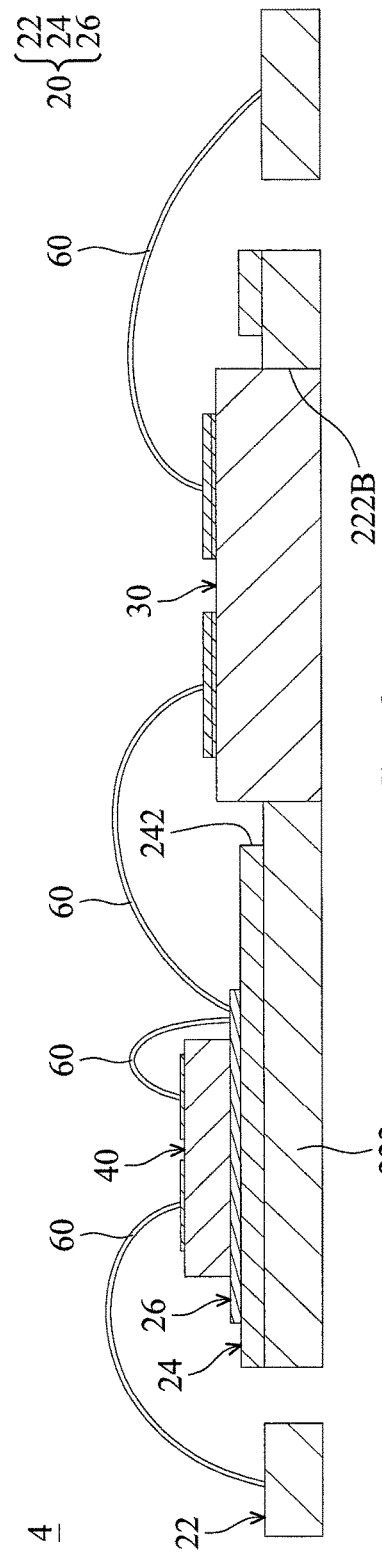
FIG. 6 is a schematic cross-sectional view of a power module package in accordance with another embodiment of the invention.

FIG. 6 illustrates a schematic cross-sectional view of a power module package 4 in accordance with another embodiment of the invention. The power module package 4 differs from the power module package 2 (FIG. 2) described above in that the second part 222 of the metal carrier 22 further includes an opening 222B which penetrates through the top and bottom surfaces thereof and which is not covered by the insulation layer 24 (i.e. formed in the opening 242), and the first semiconductor power chip 30 is disposed therein. Since the first semiconductor power chip 30 abuts the side walls of the opening 222B and is directly exposed to the outside environment from the bottom surface of the metal carrier 22, the heat generated from the first semiconductor power chip 30 can be dissipated more effectively.

Figure 7:
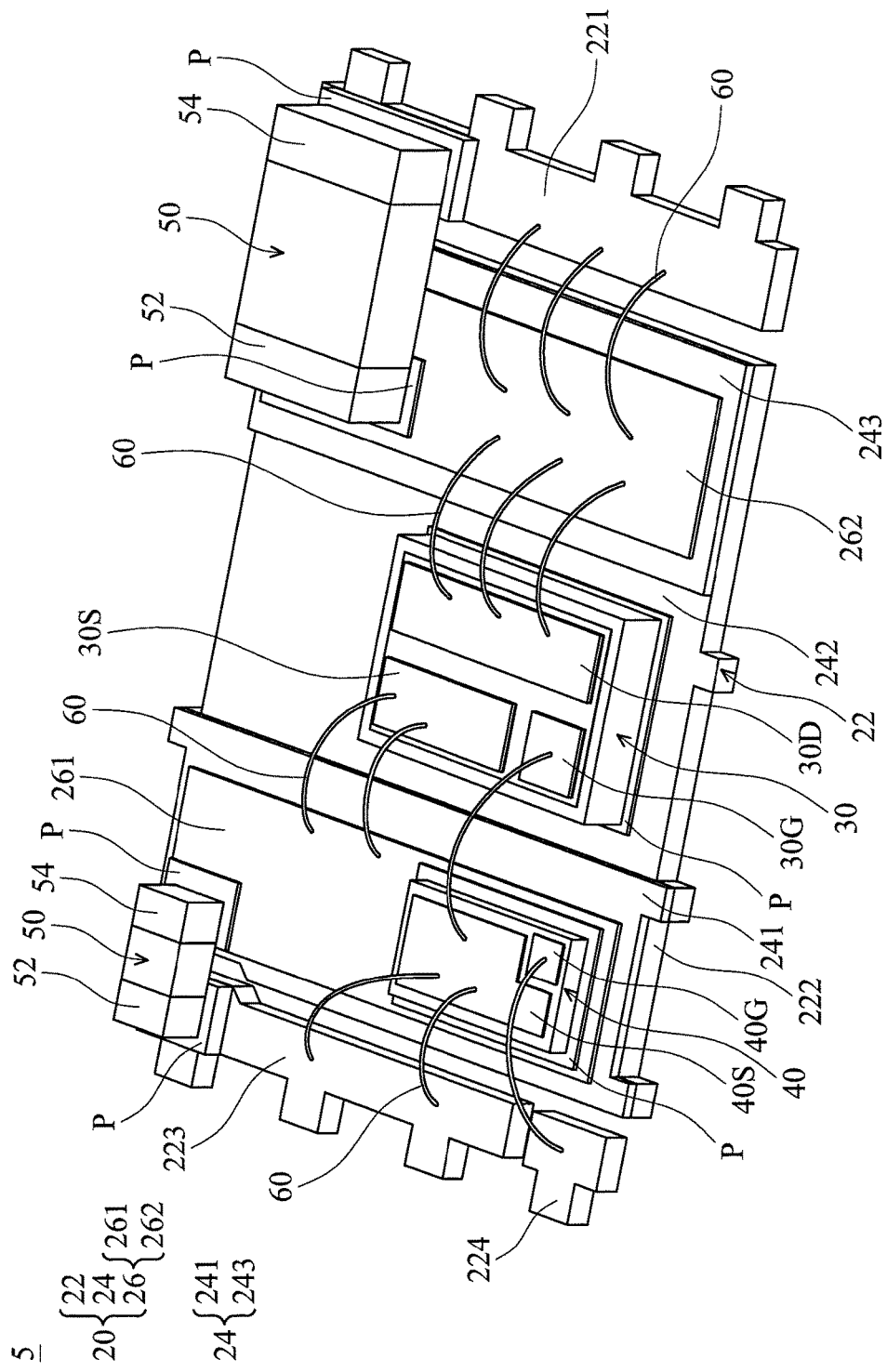
FIG. 7 is a schematic perspective view of a power module package in accordance with another embodiment of the invention.

FIG. 7 illustrates a schematic perspective view of a power module package 5 in accordance with another embodiment of the invention. The power module package 5 differs from the power module package 2 (FIG. 2) described above in that the insulation layer 24 is patterned to include a first patterned insulation portion 241 and a second patterned insulation portion 243 separated from each other. The first semiconductor power chip 30 is disposed between the first and second patterned insulation portions 241 and 243 (i.e. it is disposed in an opening 242 (an exposure area) between the first and second patterned insulation portions 241 and 243). In other words, the first and second patterned insulation portions 241 and 243 are arranged on two opposite sides of the first semiconductor power chip 30 (in contrast, the patterned insulation layer 24 in the embodiment of FIG. 2 surrounds the first semiconductor power chip 30), and the first semiconductor power chip 30 is directly connected to the second part 222 of the metal carrier 22.

In addition, in this embodiment (FIG. 7), the conductive layer 26 is patterned to include a first patterned conductive part 261 and a second patterned conductive part 262 separated from each other, and the first and second patterned conductive parts 261 and 262 are disposed on and partially cover the first and second patterned insulation portions 241 and 243, respectively. The second semiconductor power chip 40 is disposed on and electrically connected to the first patterned conductive part 261. It should also be noted that the first drain pad 30D of the first semiconductor power chip 30 in this embodiment is electrically connected to the second patterned conductive part 262 on the second patterned insulation portion 243 and then is electrically connected to the first part 221 of the metal carrier 22 via a plurality of wires 60, rather than being directly electrically connected to the first part 221 of the metal carrier 22 via at least one of the wires 60, as in the embodiment of FIG. 2.

Figure 8:
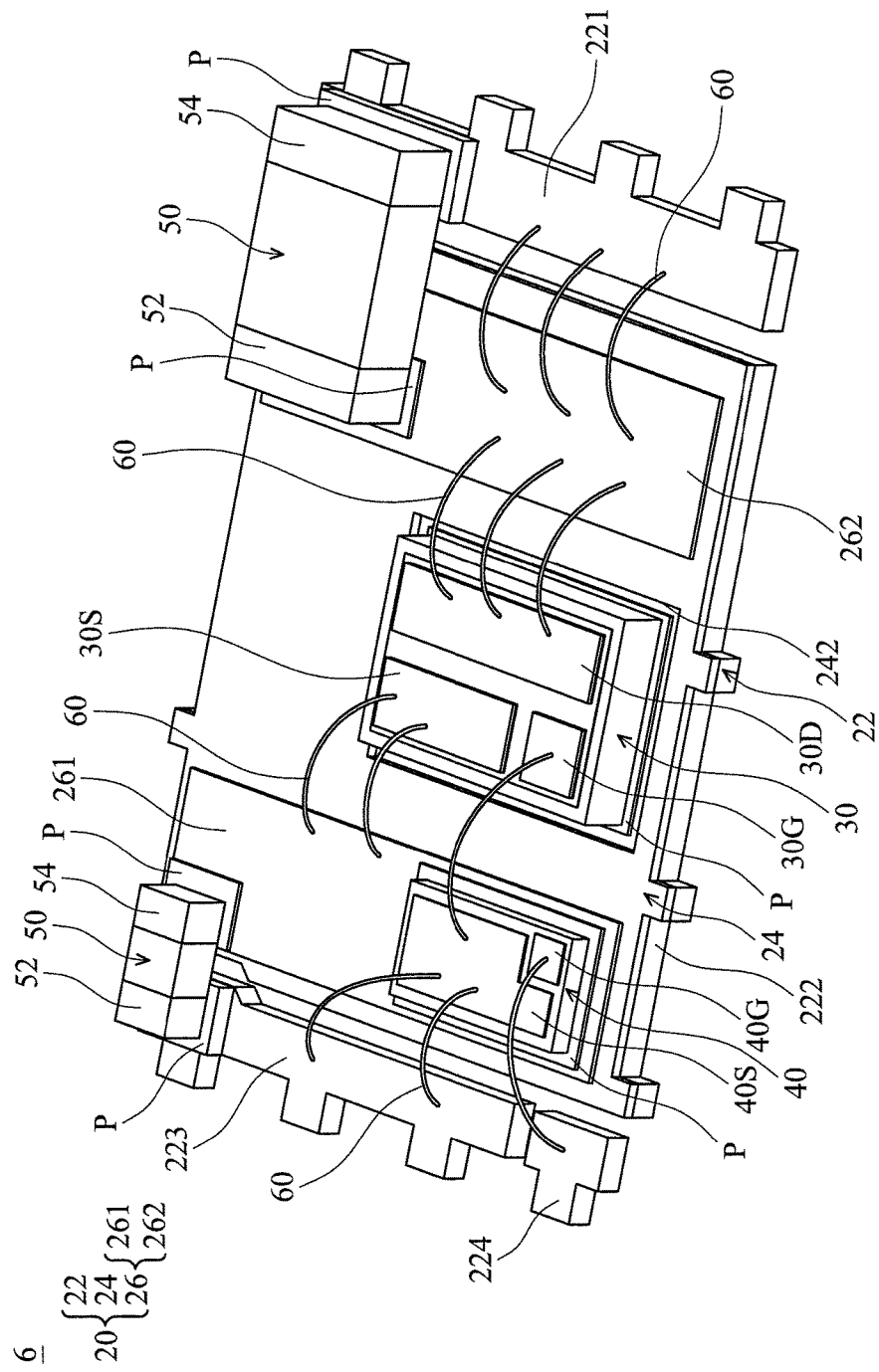
FIG. 8 is a schematic perspective view of a power module package in accordance with another embodiment of the invention.

FIG. 8 illustrates a schematic perspective view of a power module package 6 in accordance with another embodiment of the invention. The power module package 6 differs from the power module package 2 (FIG. 2) described above in that the conductive layer 26 is patterned to include a first patterned conductive part 261 and a second patterned conductive part 262 separated from each other, and the first and second patterned conductive parts 261 and 262 are arranged on two opposite sides of the first semiconductor power chip 30. The second semiconductor power chip 40 is disposed on and electrically connected to the first patterned conductive part 261. It should also be noted that, the first drain pad 30D of the first semiconductor power chip 30 in this embodiment is electrically connected to the second patterned conductive part 262 on the insulation layer 24 and then is electrically connected to the first part 221 of the metal carrier 22 via a plurality of wires 60, rather than being directly electrically connected to the first part 221 of the metal carrier 22 via at least one of the wires 60, as in the embodiment of FIG. 2.

Furthermore, although the patterned insulation layer 24 surrounds the first semiconductor power chip 30 in this embodiment (FIG. 8), it may also partially surround the first semiconductor power chip 30, that is, at least one side of the first semiconductor power chip 30 may not be surrounded by the patterned insulation layer 24.

Next, a method of manufacturing the aforementioned patterned insulation metal substrate 20 (FIGS. 2-8) in accordance with an embodiment of the invention is described above. Referring to FIGS. 9A to 9E in sequence.

Figure 9A:
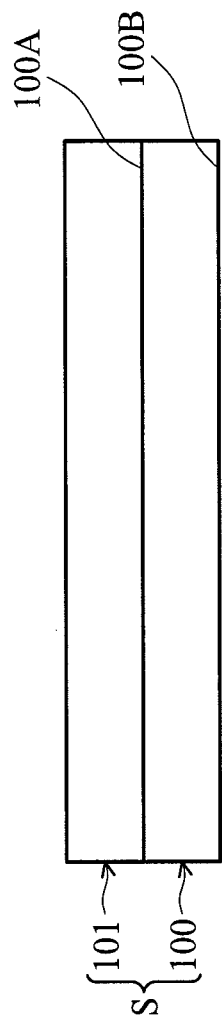
Figure 9B:
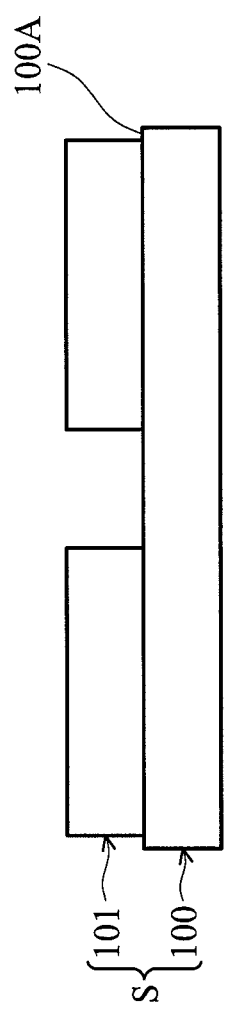

As shown in FIG. 9A, a substrate S including an insulation layer 100 and a conductive layer 101 formed on the top surface 100A of the insulation layer 100 is provided first. In this embodiment, the insulation layer 100 may comprise fiberglass epoxy fiberglass, epoxies, silicones, urethanes, or acrylates which could add aluminum oxide, boron nitride, zinc oxide or aluminum nitride as fillers to increase thermal conductivity, and the conductive layer 101 may comprise metal (e.g. copper). Then, as shown in FIG. 9B, a photolithography process (comprising steps of exposure, developing, and etching etc.) is performed so that the conductive layer 101 on the insulation layer 100 is patterned.

As shown in FIG. 9C, after the conductive layer 101 is patterned, an adhesive side 102 is formed on the bottom surface 100B of the insulation layer 100. In this embodiment, the adhesive side 102 is formed by applying a double-sided adhesive to the bottom surface 100B of the insulation layer 100. Then, as shown in FIG. 9D, a drill processing such as laser or mechanical drilling is performed to form at least one opening 103 through the insulation layer 100. It should be realized that the patterned conductive layer 101, the insulation layer 100 after the drill processing, and the opening 103 correspond to the patterned conductive layer 26, the patterned insulation layer 24, and the opening 242, respectively, of the aforementioned patterned insulation metal substrate 20 (FIGS. 2~8).

Figure 9E:
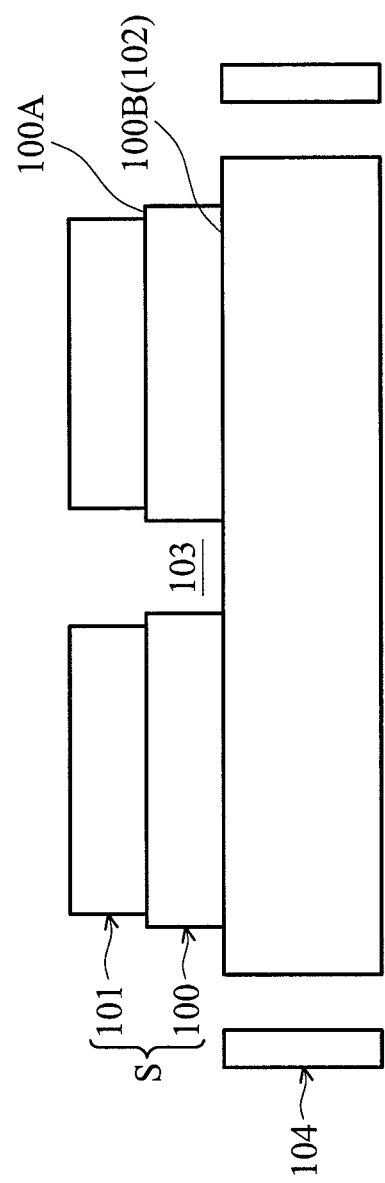

As shown in FIG. 9E, after the opening 103 through the insulation layer 100 is formed, a patterned metal carrier 104 such as a lead frame is provided, and then the patterned metal carrier 104 is laminated to the adhesive side 102 of the insulation layer 100. The metal carrier 104 corresponds to the metal carrier 22 of the aforementioned patterned insulation metal substrate 20 (FIGS. 2~8). Consequently, the fabrication of a patterned insulation metal substrate which includes a metal carrier, a patterned insulation layer disposed on the metal carrier and partially covering the metal carrier, and a patterned conductive layer disposed on the patterned insulation layer is completed.

It should also be realized that, in some embodiments, after the opening 103 through the insulation layer 100 is formed (FIG. 9D), a non-patterned metal carrier 104 can be laminated to the adhesive side 102 of the insulation layer 100 firstly, and then the non-patterned metal carrier 104 is patterned (FIG. 9E) by, for example, laser drilling or photolithography process (comprising steps of exposure, developing, and etching etc.), so as to complete the fabrication of a patterned insulation metal substrate which includes a metal carrier, a patterned insulation layer disposed on the metal carrier and partially covering the metal carrier, and a patterned conductive layer disposed on the patterned insulation layer.

As mentioned above, the invention provides a power module package having a patterned insulation metal substrate (PIMS). Since the patterned insulation layer in the PIMS will not block the heat generated from the semiconductor power chips mounted on the PIMS, the power module package can have a better heat dissipation ability and improved reliability.

The following discloses some packaging structures in accordance with some embodiments of the present invention. A conductive unit is used to interconnect different components of the packaging structure. The conductive unit may include a clip bond or a redistribution layer structure with a larger cooling area than the wires, thus providing a better heat dissipation.

Figure 10:
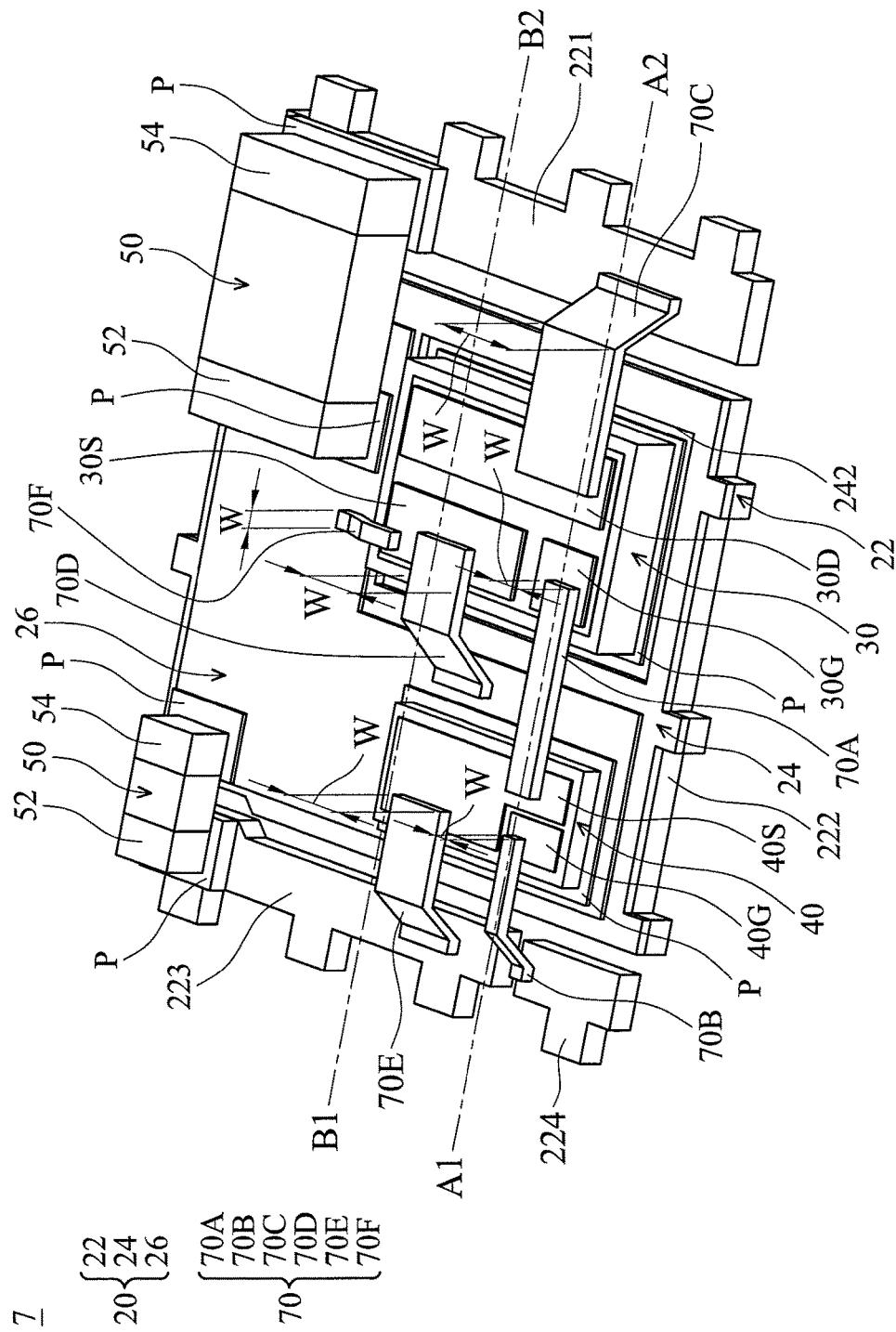
FIG. 10 is a schematic perspective view of a power module package in accordance with some embodiments of the invention.

FIG. 10 is a schematic perspective view of a power module package 7 in accordance with some embodiments of the invention. The power module package 7 includes a patterned insulation metal substrate 20 similar to that of the power module package 2. One difference between power module package 7 and power module package 2 is that a conductive unit 70 is configured to interconnect different components of the power module package 7.

Figure 11A:
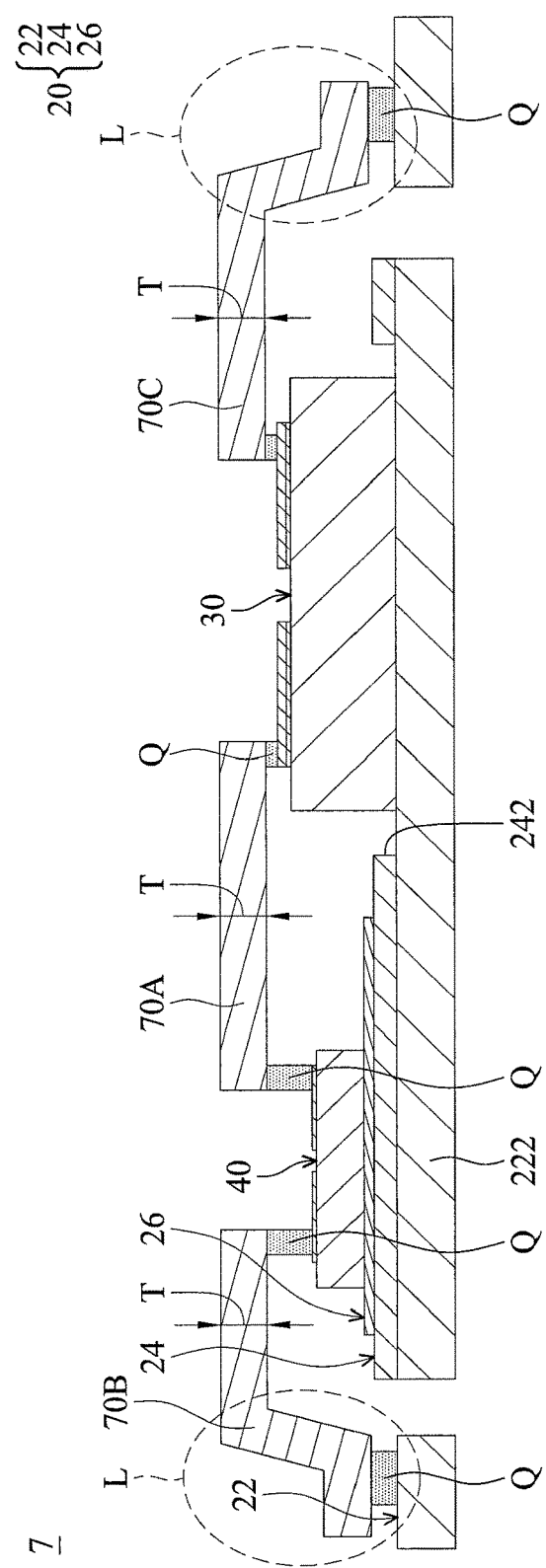
FIG. 11A to FIG. 11B are schematic cross-sectional views of a power module package in accordance with some embodiments of the invention.
Figure 11B:
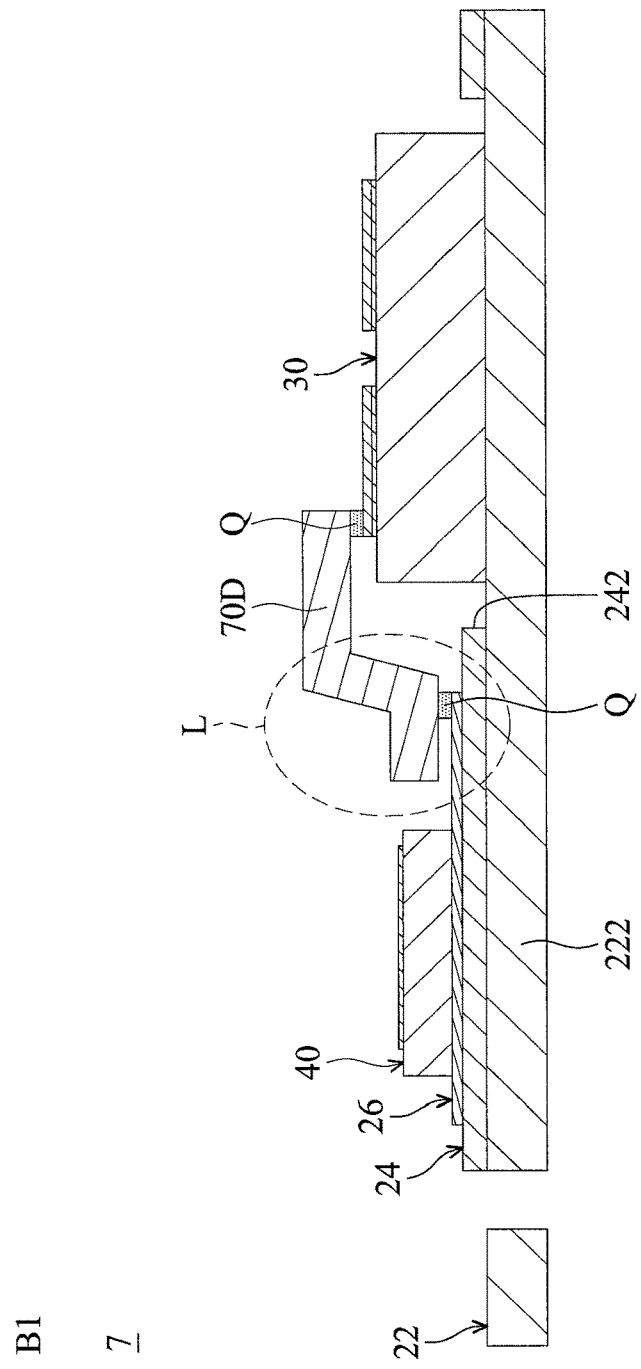

FIGS. 11A, and 11B are schematic cross-sectional views of the power module package 7 taken along line A1-A2 and B1-B2 of FIG. 10. In some embodiments, the conductive unit 70 may include a plurality of clip bonds (e.g., 70A, 70B, 70C, 70D, 70E, and 70F). The clip bonds may be made of suitable conductive materials, such as copper, gold, aluminum, an alloy thereof, or a combination thereof. Each of the clip bonds is electrically connected to at least two of the first semiconductor power chip 30, second semiconductor power chip 40, and the patterned insulation metal substrate 20. For example, the clip bond 70A is electrically connected to the first gate pad 30G of the first semiconductor power chip 30 and the second source pad 40S of the second semiconductor power chip 40, the clip bond 70D is electrically connected to the patterned conductive layer 26 and the first source pad 30S, and the clip bond 70C is electrically connected to the metal carrier 22 and the first drain pad 30D. As shown in FIGS. 10, 11A, and 11B, each of the clip bonds may have a thickness T and a width W. For example, the thickness T may be 25 µm-1000 µm, and the width W may be 50 µm-2000 µm, which are larger than the diameter of a wire (e.g., 10 µm-500 µm).

As shown in FIGS. 11A and 11B, at least one of the clip bonds may have a leg portion which is bent toward the patterned insulation metal substrate 20. For example, the clip bond 70B has a leg portion L bent toward the patterned insulation metal substrate 20 and electrically connected to the metal carrier 22 of the patterned insulation metal substrate 20, and the clip bond 70D has a leg portion L bent toward the patterned insulation metal substrate 20 and electrically connected to the patterned conductive layer 26 of the patterned insulation metal substrate 20. The leg portion L of the clip bond may be located away from a region between the first semiconductor power chip 30 and the second semiconductor power chip 40 (e.g., clip bonds 70B and 70C). However, the leg portion L of the clip bond may be also located between the first semiconductor power chip 30 and the second semiconductor power chip 40 (e.g. clip bond 70D). In some embodiments, since the clip bond has a leg portion bent toward the patterned insulation metal substrate 20 (e.g., clip bond 70D in FIG. 11B), the patterned insulation metal substrate 20 can be electrically connected to the clip bond without a protrusion toward the clip bond.

As shown in FIGS. 11A and 11B, a bonding material Q may be used to connect the plurality of clip bonds to the patterned insulation metal substrate 20, the first semiconductor power chip 30, or the second semiconductor power chip 40. For example, the bonding material Q may include metal alloy, solder paste, silver adhesive, or other suitable conductive adhesive. In some embodiments, the bonding material Q may be designed to have different thicknesses, such that each of the clip bonds may have a top surface substantially parallel to the top surface of the metal carrier 22. In some embodiments, the bonding material Q may be designed to have different thicknesses, such that top surfaces of the clip bonds may be substantially level with each other.

Figure 12A:
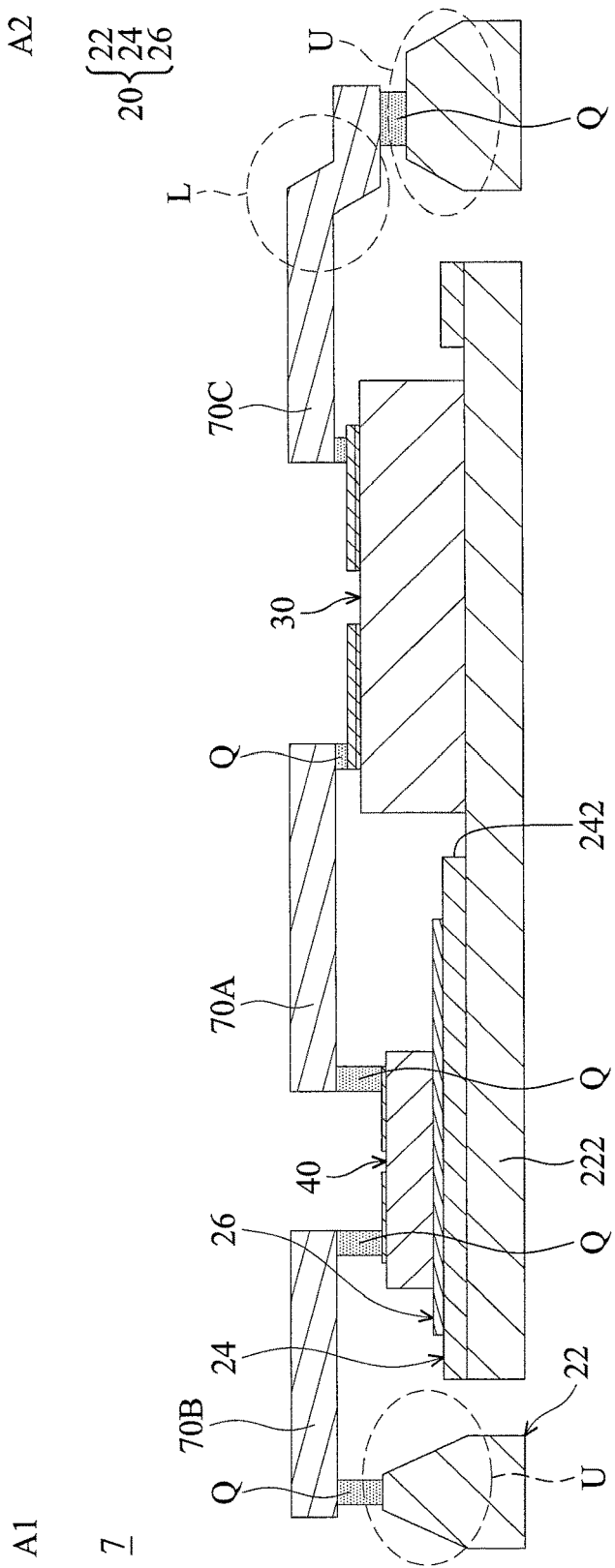
FIG. 12A to FIG. 12B are schematic cross-sectional views of a power module package in accordance with some embodiments of the invention.
Figure 12B:
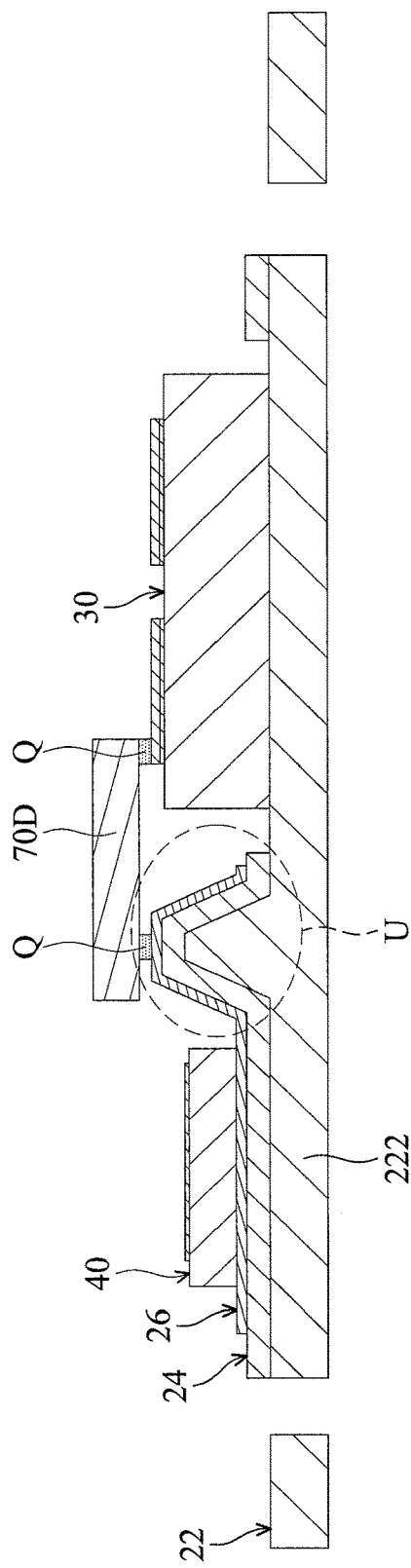

In some embodiments, as shown in FIGS. 12A and 12B, the patterned insulation metal substrate 20 may include at least a protrusion U projecting toward and electrically connected to one of the plurality of clip bonds. For example, the patterned insulation metal substrate 20 may include a protrusion U projecting toward and electrically connected to the clip bond 70B as shown in FIG. 12A. In some embodiments, the clip bond without a leg portion may be connected to the patterned insulation metal substrate 20 through the protrusion U. For example, the clip bond 70B without a leg portion is connected to the metal carrier 22 through the protrusion U as shown in FIG. 12A, and the clip bond 70D without a leg portion is connected to the patterned conductive layer 26 through the protrusion U as shown in FIG. 12B. The protrusion U may include a portion of the patterned insulation layer 24, a portion of the patterned conductive layer 26, and a portion of the metal carrier 22 as shown in FIG. 12B. The protrusion U of the insulation metal substrate 20 may be located away from a region between the first semiconductor power chip 30 and the second semiconductor power chip 40, as shown in FIG. 12A. However, the protrusion U of the insulation metal substrate 20 may be also located between the first semiconductor power chip 30 and the second semiconductor power chip 40 as shown in FIG. 12B. In some embodiments, the clip bond without a leg portion bent toward the patterned insulation metal substrate 20 can be electrically connected to the patterned insulation metal substrate 20 via the protrusion U (e.g., clip bond 70D in FIG. 12B).

Figure 13A:
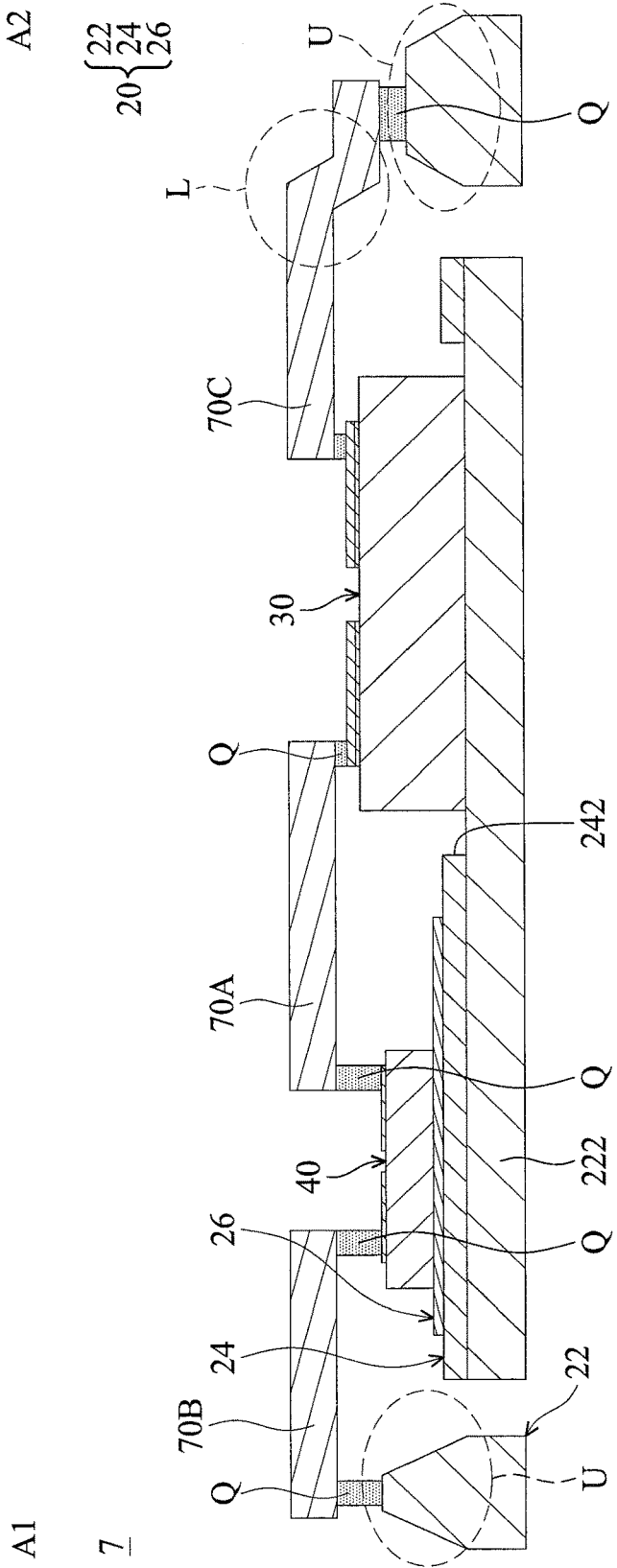
FIG. 13A to FIG. 13B are schematic cross-sectional views of a power module package in accordance with some embodiments of the invention.
Figure 13B:
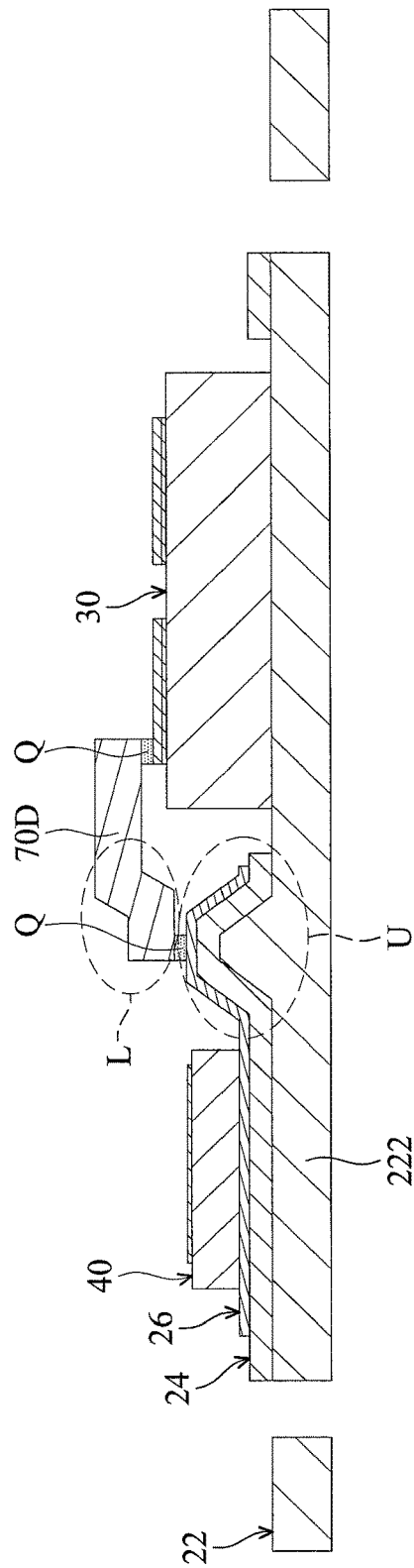

In some embodiments, as shown in FIGS. 13A and 13B, some clip bonds have a leg portion L electrically connected to the patterned insulation metal substrate 20 through the protrusion U. For example, the leg portion L of the clip bond 70C is connected to the protrusion U including a portion of the metal carrier 22, and the leg portion L of the clip bond 70D is connected to the protrusion U including a portion of the metal carrier 22, a portion of the patterned insulation layer 24, and a portion of the patterned conductive layer 26.

Figure 14A:
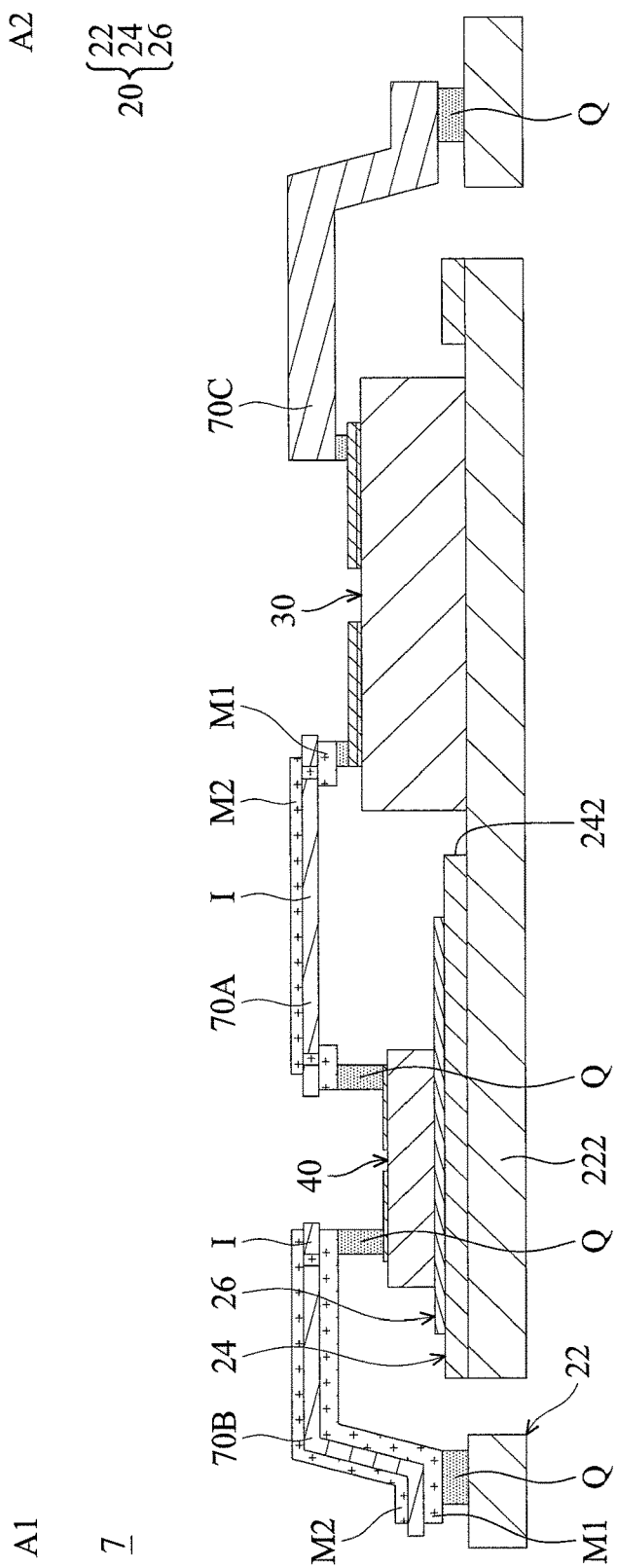
FIG. 14A to FIG. 14D are schematic cross-sectional views of power module packages with RDL structures in accordance with some embodiments of the invention.
Figure 14B:
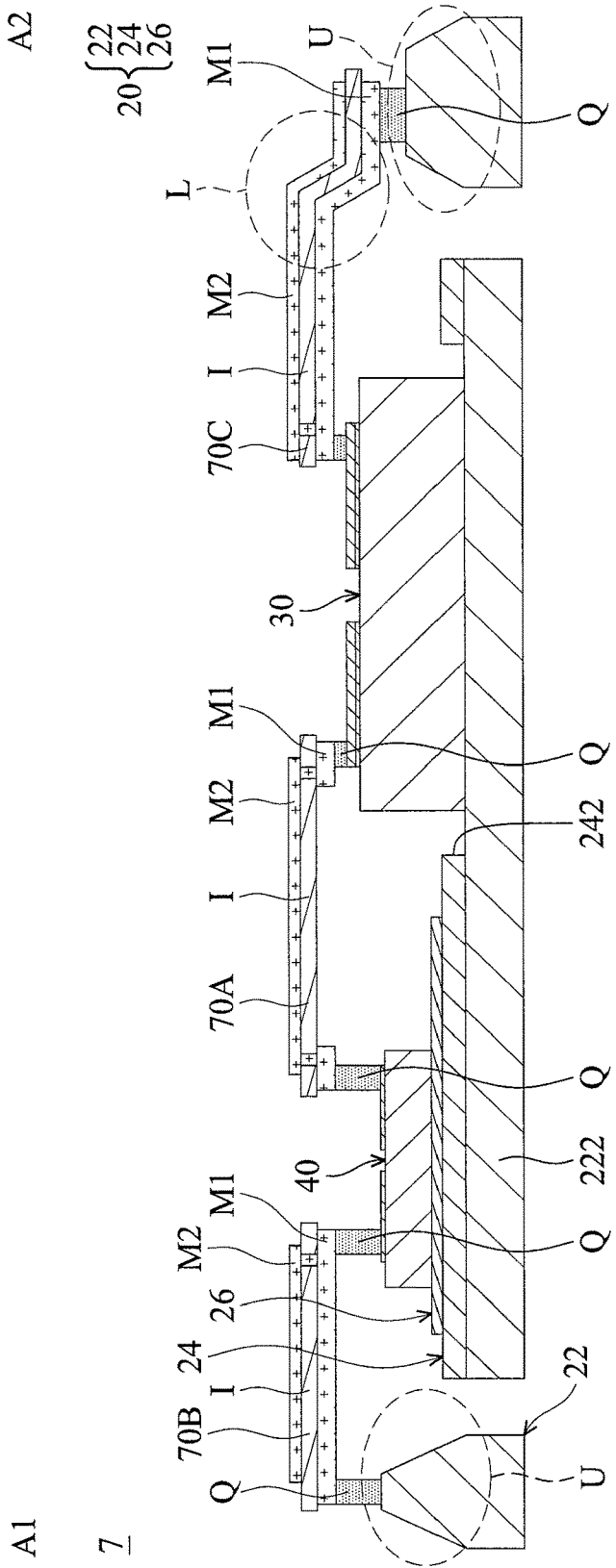
Figure 14C:
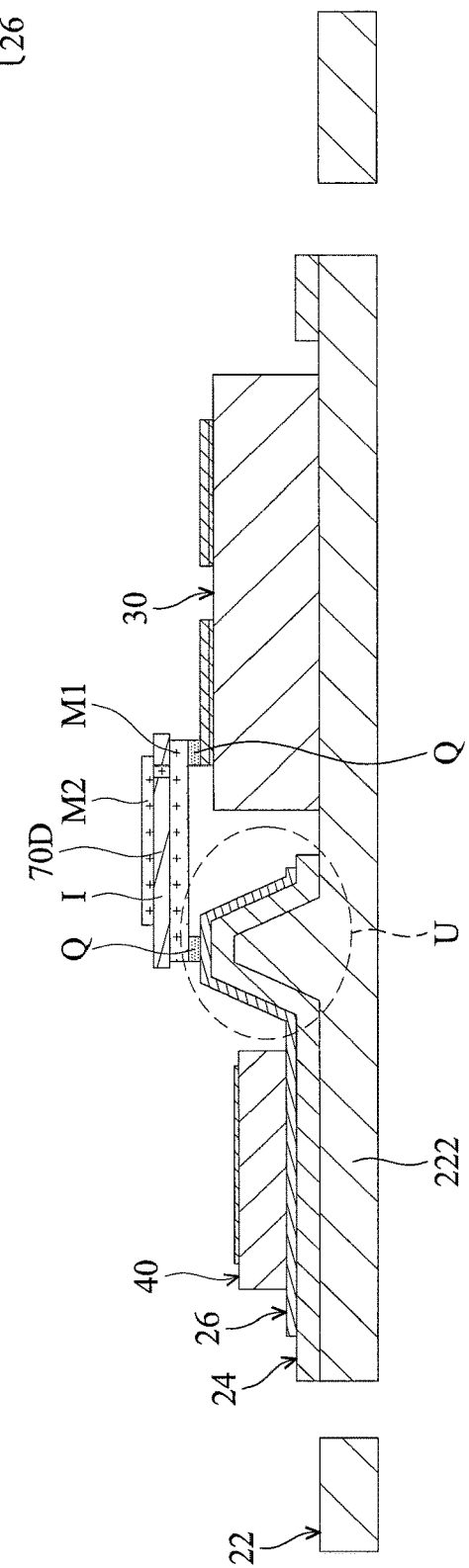
Figure 14D:
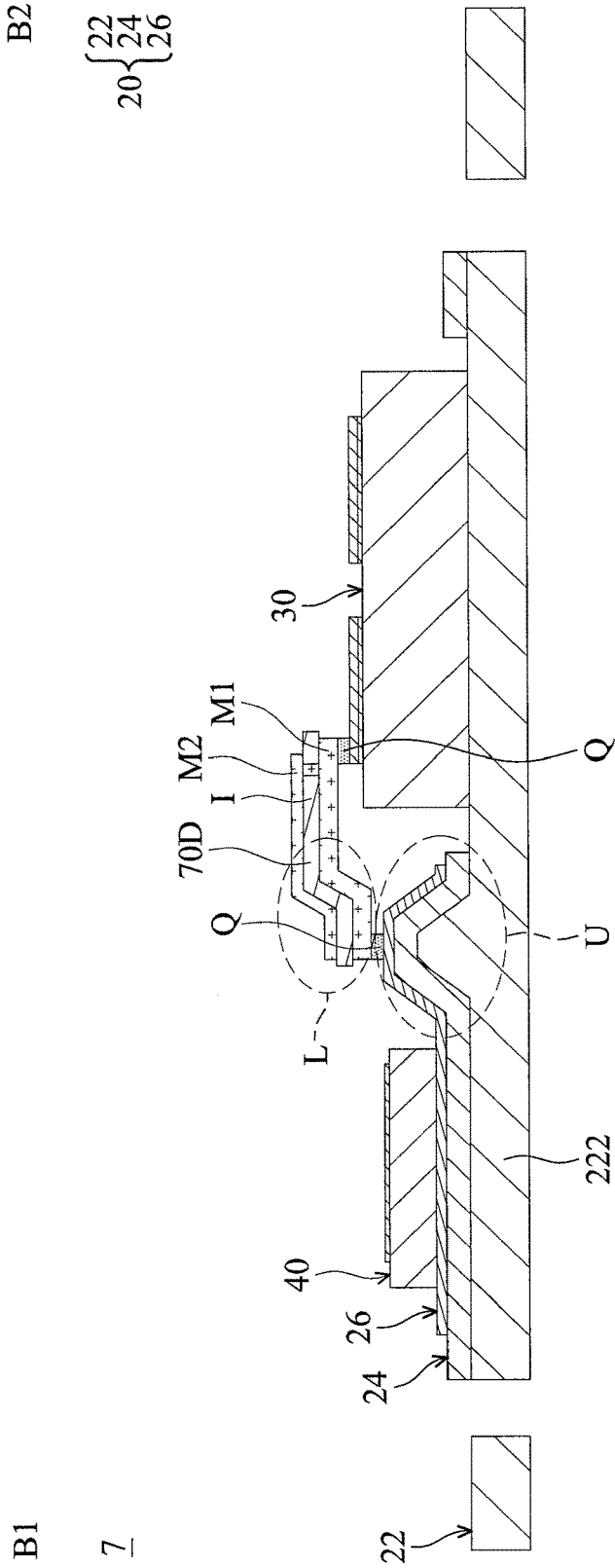

In some embodiments, as shown in FIGS. 14A-14D, the clip bond may be replaced with a redistribution layer (RDL) structure (e.g., RDL structures 70B and 70A in FIG. 14A, RDL structures 70A, 70B, and 70C in FIG. 14B, RDL structure 70D in FIG. 14C, and RDL structure 70D in FIG. 14D). The RDL structure might increase the flexibility of circuit routing. The RDL structure may include at least a wiring layer (e.g., a metallization layer) and at least an insulation layer stacked over one another. For example, the RDL structure may include a metallization layer M1, a metallization layer M2, and an insulation layer I disposed between the metallization layers M1 and M2. For example, the metallization layer M1 and M2 may be made of copper, gold, aluminum, an alloy thereof, or a combination thereof. In some embodiments, the thickness of the metallization layer M1 and the thickness of the metallization layer M2 may be different (e.g., metallization layer M1 which is closer to the substrate has a larger thickness than metallization layer M2). In some embodiments, the metallization layer with larger thickness may be used for high current loop (e.g., a power loop), and the metallization layer with smaller thickness may be used for low current loop (e.g., a signal loop), and thus the device performance may be improved.

Figure 15A:
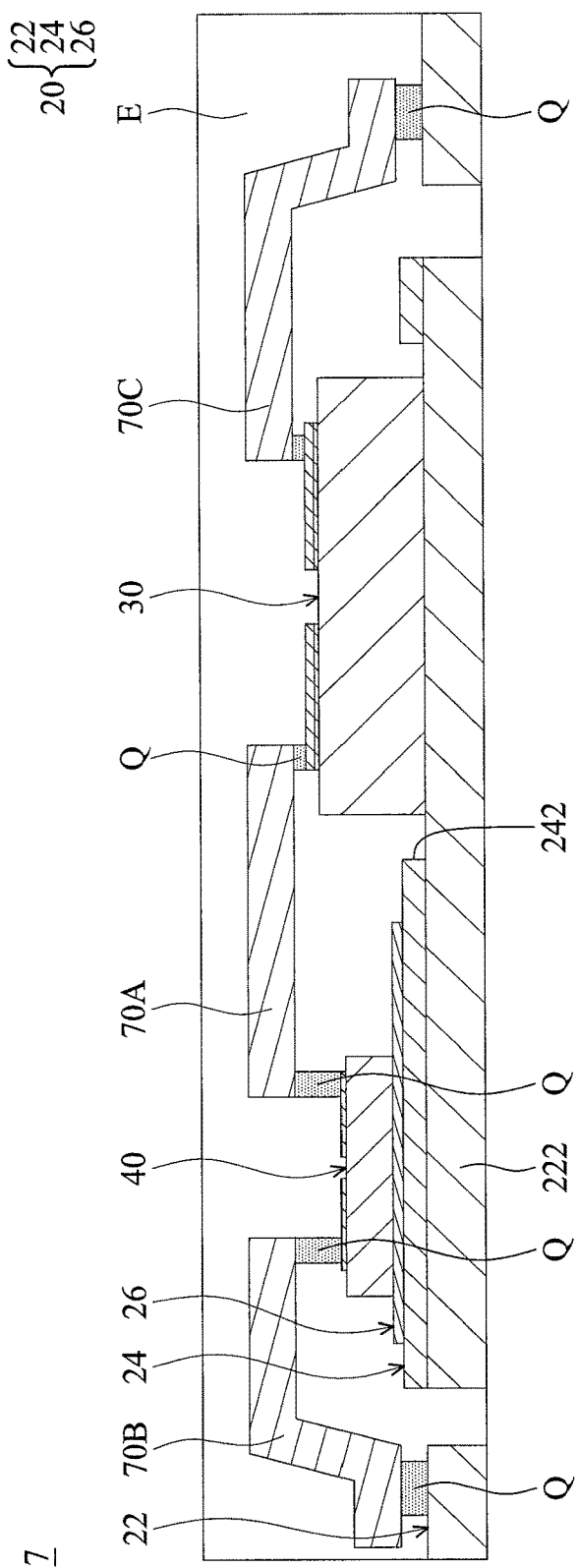
FIG. 15A to FIG. 15C are schematic cross-sectional views of power module packages with encapsulating material in accordance with some embodiments of the invention.
Figure 15:
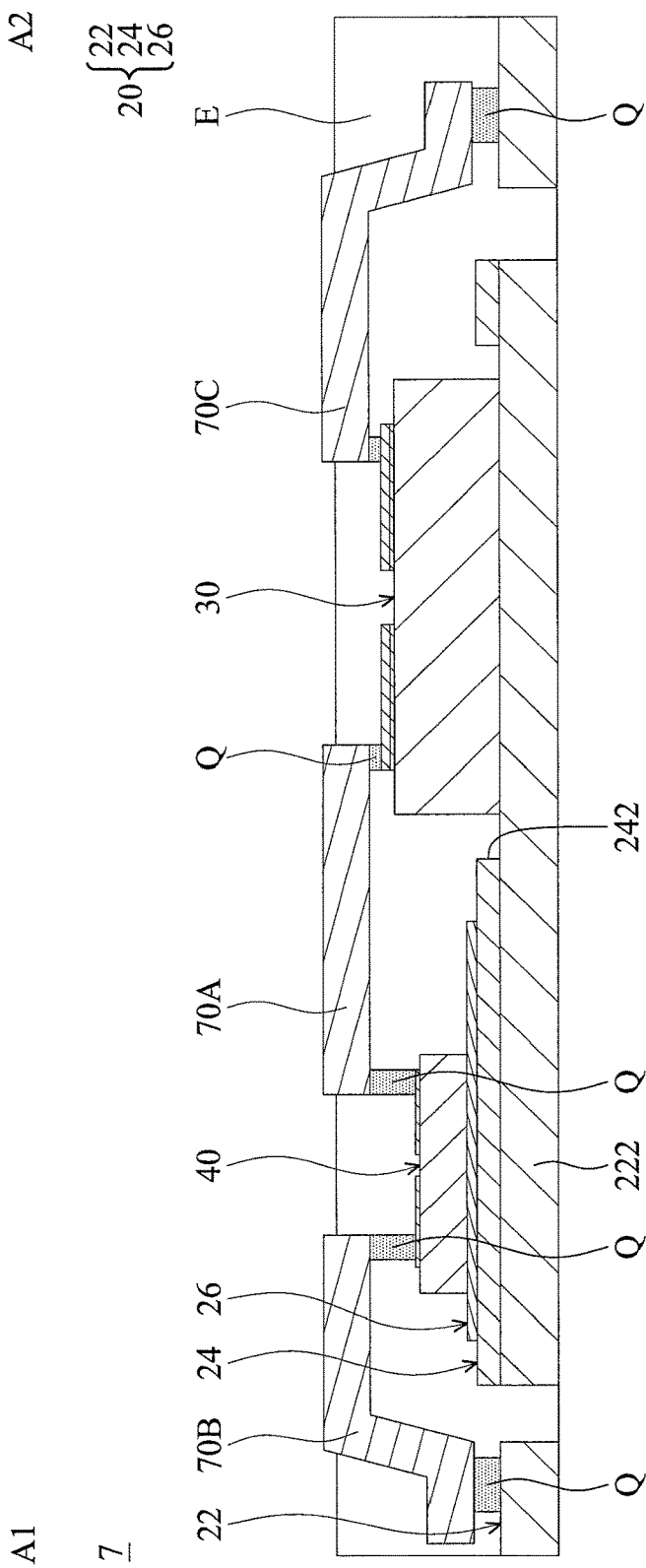
Figure 15C:
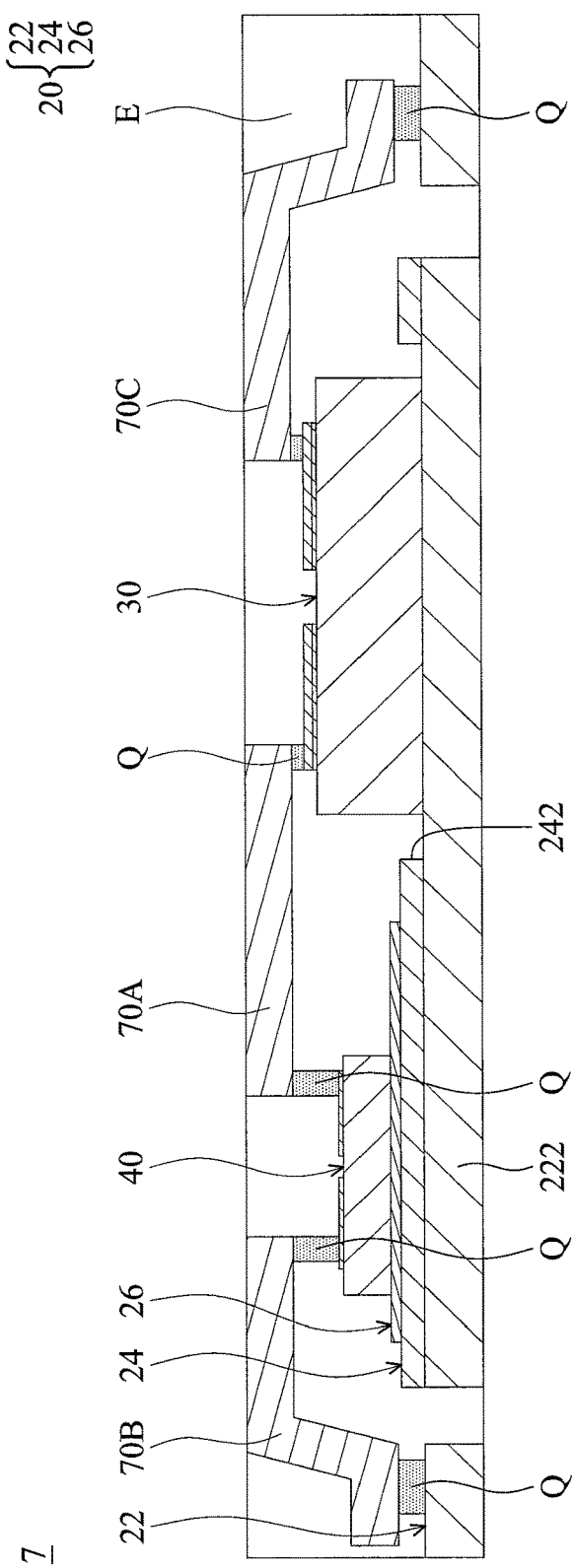

In some embodiments, as shown in FIGS. 15A, 15B, and 15C, an encapsulating material E (e.g., epoxy molding compound) is applied to provide mechanical protection and prevent the packaging structure from contamination. The encapsulating material E may surround the patterned insulation metal substrate 20, the first semiconductor power chip 30, the second semiconductor power chip 40, and the conductive unit 70. The encapsulating material E may expose a portion of the conductive unit 70. For example, the top surface of the conductive unit 70 is exposed from the encapsulating material E as shown in FIGS. 15B and 15C, such that a better heat dissipation may be obtained. In some embodiments, the top surface of the encapsulating material E is level with the top surface of the conductive unit 70 as shown in FIG. 15C.

Figure 16:
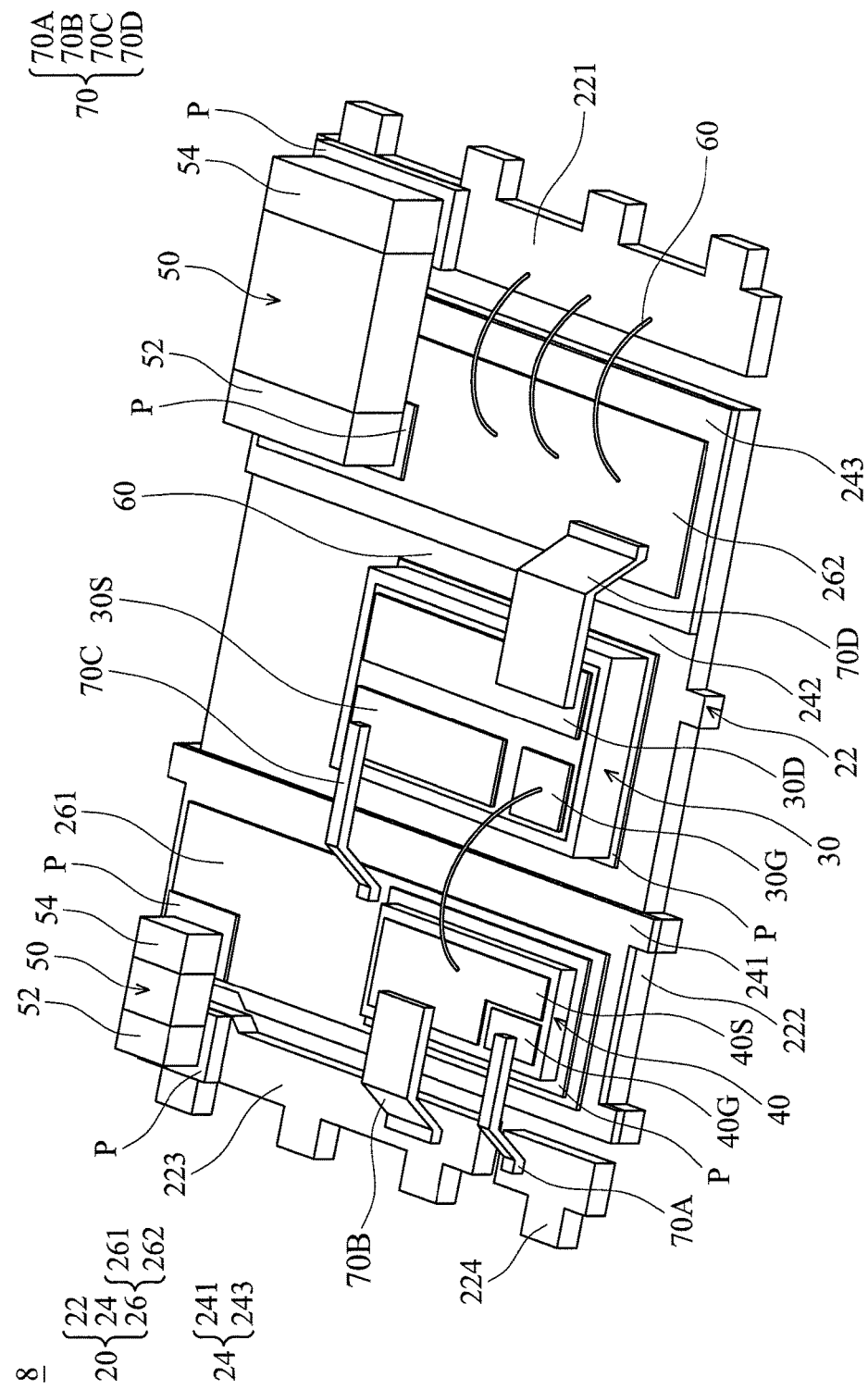
FIG. 16 is a schematic perspective view of a power module package in accordance with some embodiments of the invention.

FIG. 16 is a schematic perspective view of a power module package 8 in accordance with some embodiments of the invention. The power module package 8 may include a patterned insulation metal substrate 20 similar to that of the power module package 5. One difference between the power module package 8 and the power module package 5 is that some wire bondings of power module package 5 are replaced by the above-mentioned conductive unit 70. As shown in FIG. 16, the above-mentioned conductive unit 70 may be used to interconnect the components of the power module package 8. In addition, the above-mentioned protrusion U may also be used in the power module package 8.

Figure 17:
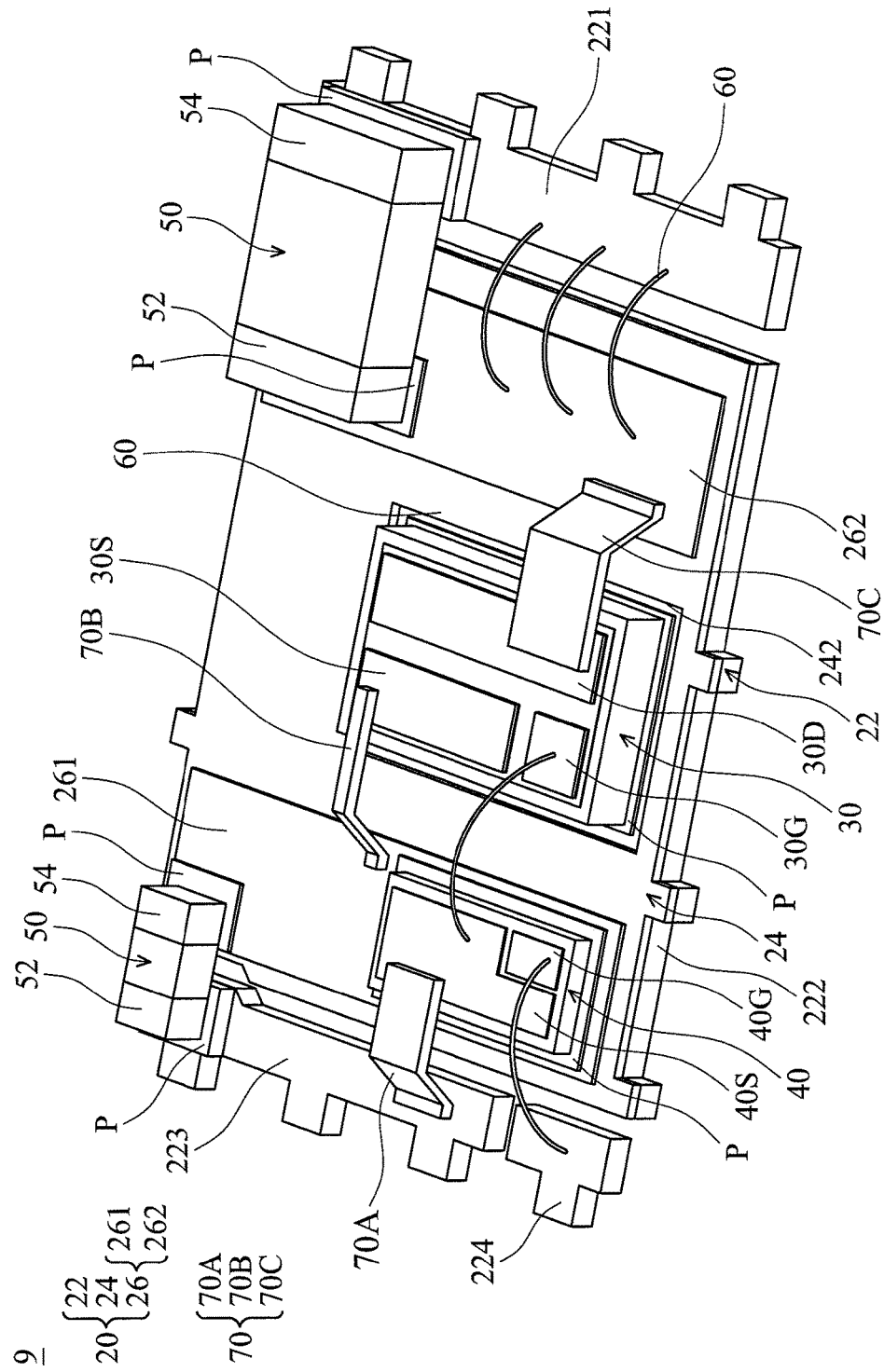
FIG. 17 is a schematic perspective view of a power module package in accordance with some embodiments of the invention.

FIG. 17 is a schematic perspective view of a power module package 9 in accordance with some embodiments of the invention. The power module package 9 may include a patterned insulation metal substrate 20 similar to that of the power module package 6. One difference between the power module package 9 and the power module package 6 is that some wire bondings of power module package 6 are replaced by the above-mentioned conductive unit 70. As shown in FIG. 17, the above-mentioned conductive unit 70 may be used to interconnect the components of the power module package 9. In addition, the above-mentioned protrusion U may also be used in the power module package 9.

Figure 18:
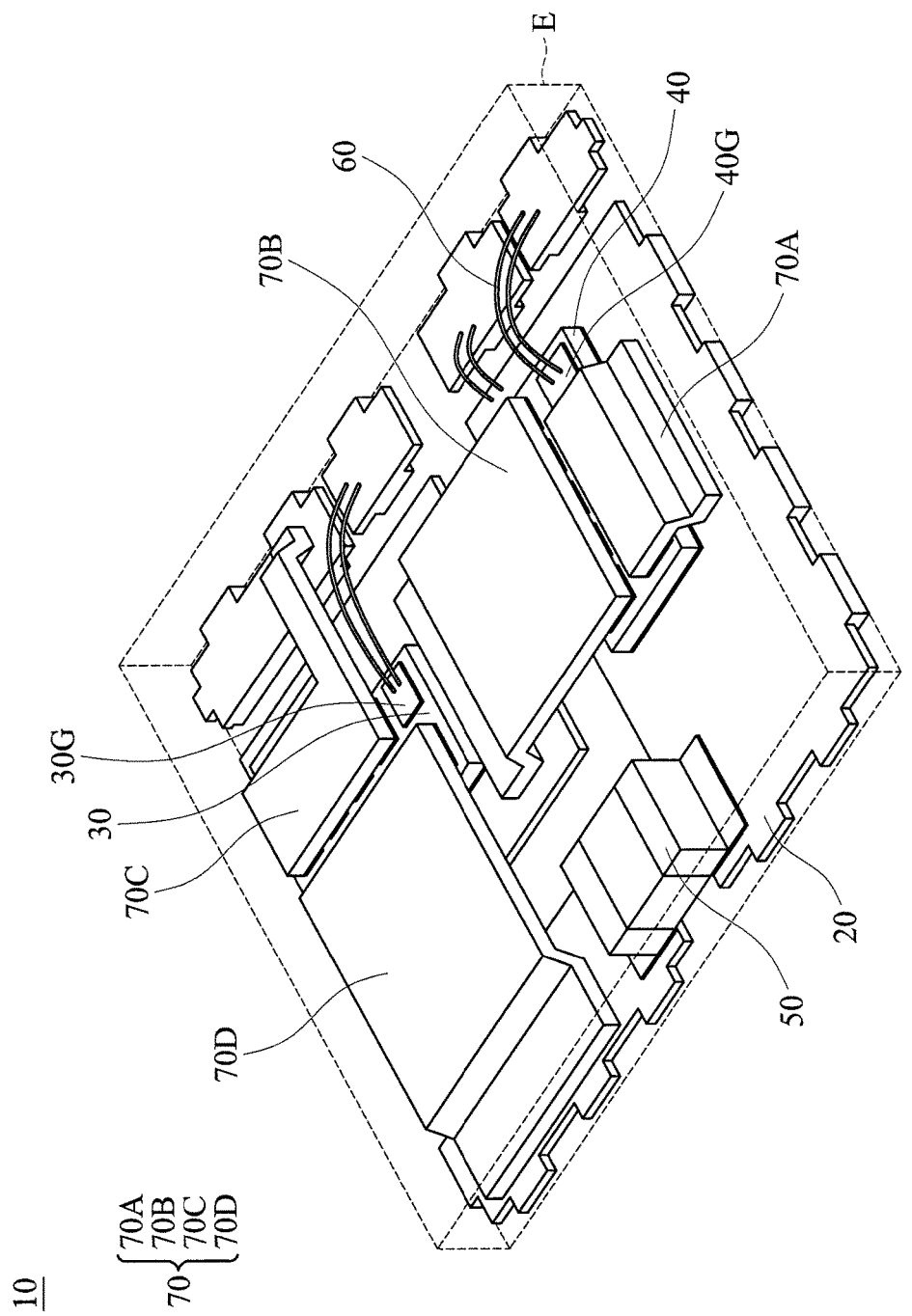
FIG. 18 is a schematic perspective view of a power module package in accordance with some embodiments of the invention.

FIG. 18 is a schematic perspective view of a power module package 10 in accordance with some embodiments of the invention. As shown in FIG. 18, the conductive unit 70 may be used together with the wires 60 to interconnect the components of the power module package 10. For example, the wires 60 are used to connect the first gate pad 30G of the first semiconductor power chip 30 and the second gate pad 40G of the second semiconductor power chip 40 to the patterned insulation metal substrate 20, and the conductive unit 70 is used to connect the source pads or the drain pads of the first semiconductor power chip 30 and the second semiconductor power chip 40 to the insulation metal substrate 20. It should be noted that, the first semiconductor power chip 30 which disposed on the metal carrier 22 not covered by the patterned insulation layer 24 may be a lateral semiconductor component, and the second semiconductor power chip 40 disposed on the patterned conductive layer 26 may be a lateral semiconductor component or a vertical semiconductor component.

It should be noted that the above-mentioned conductive unit 70 and protrusion U may be adopted to every power module package of the above embodiments. For example, the conductive unit 70 and protrusion U may also be applied to the power module packages 3 and 4 illustrated in FIG. 5 and FIG. 6.

As mentioned above, embodiments of the invention provide a packaging structure having a patterned insulation metal substrate (PIMS). Since the patterned insulation layer in the PIMS will not block the heat generated from the semiconductor power chips mounted on the PIMS, the power module package can have a better heat dissipation ability and improved reliability. Furthermore, since the packaging structure has a conductive unit (e.g., clip bonds or RDL structures) with larger cooling area, the packaging structure may have an even better heat dissipation ability and improved reliability.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A packaging structure, comprising:
a substrate including a metal carrier, a patterned insulation layer disposed on the metal carrier and partially covering the metal carrier, and a patterned conductive layer disposed on the patterned insulation layer;
a first chip disposed on the metal carrier not covered by the patterned insulation layer;
a second chip disposed on the patterned conductive layer and electrically connected to the first chip by a conductive unit comprising one or more clip bonds, one or more redistribution layer (RDL) structures comprising at least one wiring layer and at least one insulation layer stacked over one another, or a combination thereof; and
an encapsulating material surrounding the substrate, the first chip, the second chip, and the conductive unit, wherein a portion of the conductive unit is exposed from the encapsulating material.

2. The packaging structure as claimed in claim 1, wherein each of the clip bonds and the redistribution layer structures is electrically connected to at least two of the first chip, the second chip, and the substrate.

3. The packaging structure as claimed in claim 1, wherein the substrate comprises a protrusion projecting toward and electrically connected to the conductive unit.

4. The packaging structure as claimed in claim 3, wherein the protrusion of the substrate comprises a portion of the patterned insulation layer, and a portion of the patterned conductive layer disposed on the portion of the patterned insulation layer.

5. The packaging structure as claimed in claim 3, wherein the protrusion of the substrate is located between the first chip and the second chip.

6. The packaging structure as claimed in claim 3, wherein the conductive unit comprises a leg portion electrically connected to the protrusion.

7. The packaging structure as claimed in claim 1, wherein the conductive unit comprises a leg portion which is bent toward and electrically connected to the substrate.

8. The packaging structure as claimed in claim 7, wherein the leg portion is located between the first chip and the second chip.

9. The packaging structure as claimed in claim 7, wherein the leg portion is located away from a region between the first chip and the second chip.

10. The packaging structure as claimed in claim 1, wherein the metal carrier comprises a cavity, a recess or a slot, and the first chip is disposed in the cavity, the recess or the slot.

11. The packaging structure as claimed in claim 1, wherein the metal carrier comprises an opening, and the first chip is disposed in the opening.

12. The packaging structure as claimed in claim 1, wherein the patterned insulation layer comprises a first portion covered by a portion of the patterned conductive layer, and the second chip is disposed on the portion of the patterned conductive layer.

13. The packaging structure as claimed in claim 1, wherein the patterned insulation layer comprises a first portion covered by a portion of the patterned conductive layer and a second portion covered by another portion of the patterned conductive layer, and the first chip is electrically connected to the another portion of the patterned conductive layer.

14. The packaging structure as claimed in claim 1, wherein the first chip is directly connected to the metal carrier.

15. The packaging structure as claimed in claim 1, wherein the first chip comprises a lateral semiconductor component.

16. The packaging structure as claimed in claim 1, wherein the second chip comprises a vertical semiconductor component.

17. The packaging structure as claimed in claim 1, wherein the first chip has an active side with electrodes thereon and a bottom side opposite to the active side, and the first chip is disposed on the metal carrier via the bottom side.

* * * * *